US012777704B2

(12) United States Patent
Cai et al.

(10) Patent No.: US 12,777,704 B2
(45) Date of Patent: Oct. 27, 2026

(54) SEMICONDUCTOR STRUCTURES WITH DENSELY SPACED CONTACT FEATURES

(71) Applicant: Taiwan Semiconductor Manufacturing Company, Ltd., Hsinchu (TW)

(72) Inventors: Chung-Hao Cai, Hsinchu (TW); Chia-Hsien Yao, Hsinchu (TW); Chen-Ming Lee, Taoyuan County (TW); Fu-Kai Yang, Hsinchu City (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 383 days.

(21) Appl. No.: 17/464,980

(22) Filed: Sep. 2, 2021

(65) Prior Publication Data

US 2022/0344214 A1 Oct. 27, 2022

Related U.S. Application Data

(60) Provisional application No. 63/178,106, filed on Apr. 22, 2021.

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/024* (2025.01); *H10D 30/62* (2025.01);
(Continued)

(58) Field of Classification Search
CPC ............... H10D 62/115; H10D 62/116; H10D 84/0188; H10D 30/024; H10D 30/62;
(Continued)

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |

(Continued)

FOREIGN PATENT DOCUMENTS

| | | | |
|---|---|---|---|
| TW | 201824448 | A | 7/2018 |
| TW | 201919236 | A | 5/2019 |
| TW | 202004859 | A | 1/2020 |

*Primary Examiner* — Julio J Maldonado
*Assistant Examiner* — Nathan Pridemore
(74) *Attorney, Agent, or Firm* — HAYNES AND BOONE, LLP

(57) ABSTRACT

Semiconductor structures and methods are provided. An exemplary method according to the present disclosure includes forming a first source/drain feature, a second source/drain feature and an interlayer dielectric (ILD) layer over the first and second source/drain features. The method also includes removing a portion of the ILD layer to form a cut feature opening and forming a hybrid cut feature therein to divide a to-be-formed metal layer into multiple pieces as source/drain contacts. The hybrid cut feature includes a conformal dielectric liner over the cut feature opening and a dielectric filler over the dielectric liner. During the formation of a source/drain contact opening, at least a portion of the dielectric liner extending along a sidewall of the dielectric filler is partially and selectively removed, leading to a dimension-reduced hybrid cut feature and thus a reduced spacing between two adjacent source/drain contacts.

20 Claims, 22 Drawing Sheets

(51) Int. Cl.

| | |
|---|---|
| ***H10D 30/62*** | (2025.01) |
| ***H10D 84/01*** | (2026.01) |
| ***H10D 84/83*** | (2025.01) |

(52) U.S. Cl.

CPC ..... *H10D 30/6219* (2025.01); *H10D 84/0149* (2025.01); *H10D 84/0158* (2025.01); *H10D 84/834* (2025.01)

(58) Field of Classification Search

CPC ............. H10D 84/0153; H10D 84/929; H10D 84/834; H10D 30/501; H10D 30/60; H10D 30/63; H10D 30/019; H10D 30/021; H10D 30/0198; H10D 30/0616; H10D 30/6219; H10D 30/014; H10D 30/0243; H10D 30/43; H10D 30/6735; H10D 30/6757; H10D 62/121; H10D 62/151; H10D 84/038; H10D 84/0149; H10D 84/0158; H10D 84/83; H01L 29/0649; H01L 29/0653; H01L 21/823878; H10W 20/069; H10W 20/076

See application file for complete search history.

(56) References Cited

U.S. PATENT DOCUMENTS

| | | | | |
|---|---|---|---|---|
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2018/0337176 | A1* | 11/2018 | Lee | H10D 30/024 |
| 2019/0295898 | A1* | 9/2019 | Xie | H10D 84/038 |
| 2020/0135882 | A1* | 4/2020 | Lee | H01L 21/28518 |
| 2020/0161439 | A1 | 5/2020 | You et al. | |
| 2020/0350257 | A1* | 11/2020 | Yang | H01L 21/56 |
| 2022/0122895 | A1* | 4/2022 | Chan | H10D 84/0149 |

* cited by examiner

SEMICONDUCTOR STRUCTURES WITH DENSELY SPACED CONTACT FEATURES

PRIORITY DATA

The present application claims the benefit of U.S. Provisional Application No. 63/178,106, entitled "Semiconductor Structures and Methods of Fabrication Thereof," filed Apr. 22, 2021, the entirety of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As semiconductor devices continue to scale down, challenges arise in achieving desired density and performance. For example, existing photolithography processes used in the formation of some features may not have sufficient resolution. Due to the limitations of photolithography, a dimension of a cut feature configured to isolate two adjacent contact features may not be reliably reduced, limiting the desired density of the contact features. Accordingly, although existing devices and methods for fabricating such have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
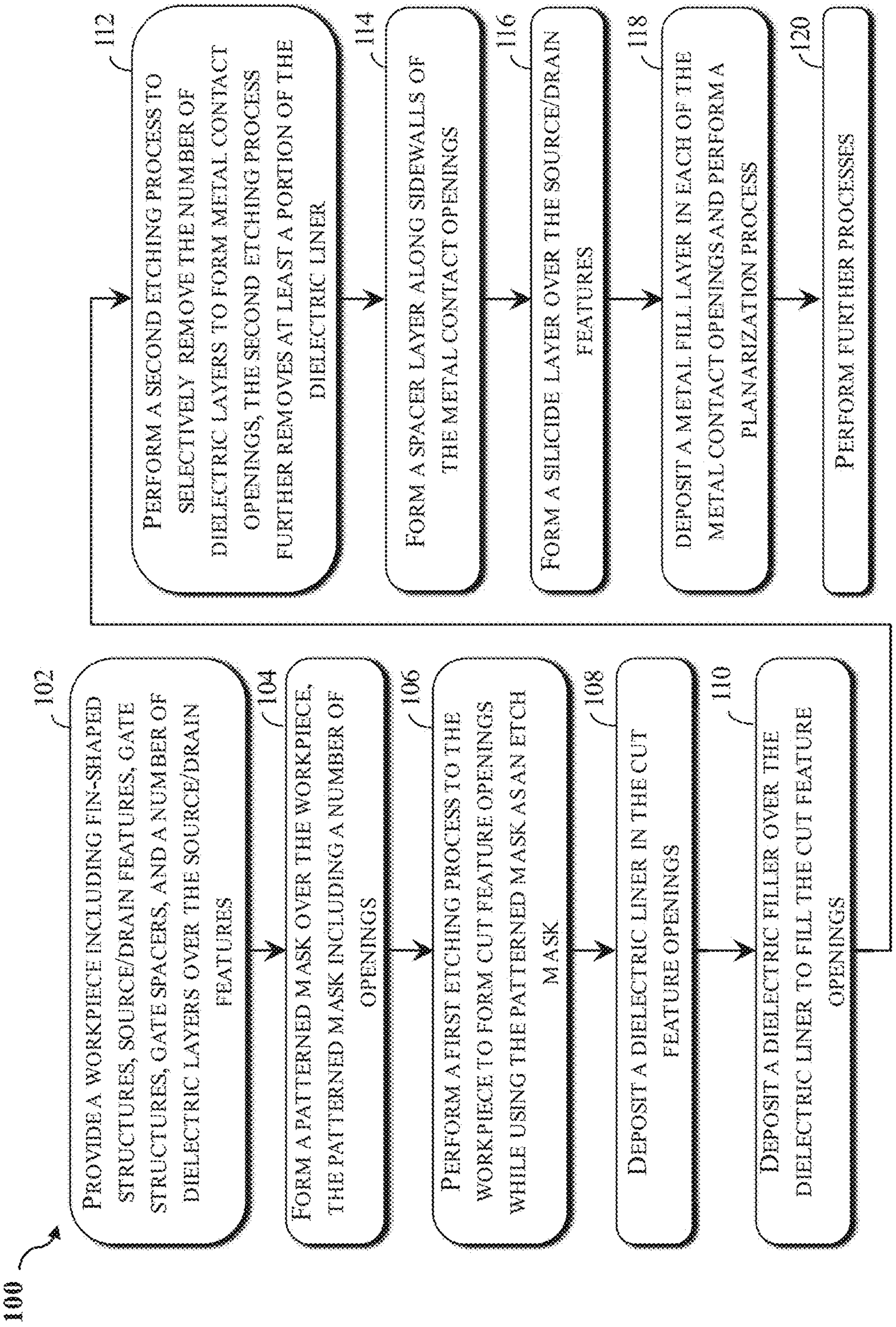
FIG. 1 illustrates a flowchart of an exemplary method for forming a semiconductor structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices, such as fin field-effect transistors (FinFETs) and multi-bridge-channel (MBC) transistors, have been introduced in an effort to improve gate control by increasing gate-channel coupling, reduce OFF-state current, and reduce short-channel effects (SCEs). A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. The three-dimensional structure of the multi-gate devices, allows them to be aggressively scaled while maintaining gate control and mitigating SCEs.

As described above, aggressive scaling down of IC dimensions has resulted in densely spaced transistors, which would result in densely spaced middle-end-of-line features (MEOL). MEOL generally encompasses processes related to fabricating contacts to conductive features (or conductive regions) of the IC devices, such as contacts to the source/drain features. The challenges in fabricating densely spaced MEOL features (e.g., source/drain contacts) may limit increase in transistor density.

The present disclosure provides semiconductor devices and methods for reducing a spacing between two adjacent source/drain contacts. An exemplary method includes forming a first source/drain feature over a first active region and a second source/drain feature over a second active region and forming an interlayer dielectric (ILD) layer over the first and second source/drain features. The method also includes removing a portion of the ILD layer to form a cut feature opening and forming a hybrid cut feature therein to divide a to-be-formed metal layer into multiple pieces as source/drain contacts. The hybrid cut feature includes a conformal dielectric liner over the cut feature opening and a dielectric filler over the dielectric liner. During the formation of a source/drain contact opening, at least a portion of the dielectric liner extending along a sidewall of the dielectric filler is partially and selectively removed, leading to a dimension-reduced hybrid cut feature and thus a reduced spacing between two adjacent source/drain contacts.

The various aspects of the present disclosure will now be described in more detail with reference to the figures. In that regard, FIG. 1 is a flowchart illustrating a method 100 of forming a semiconductor structure from a workpiece, according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIGS. 2, 5, and 20 which illustrate fragmentary top views of a workpiece 200 as well as FIGS. 3-4, 6-19, 21-33, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 as the context requires. For avoidance of doubts, the X, Y and Z directions in FIGS. 2-33 are perpendicular to one another and are used consistently throughout FIGS. 2-33. Throughout the present disclosure, like reference numerals denote like features unless otherwise excepted.

Figure 2:
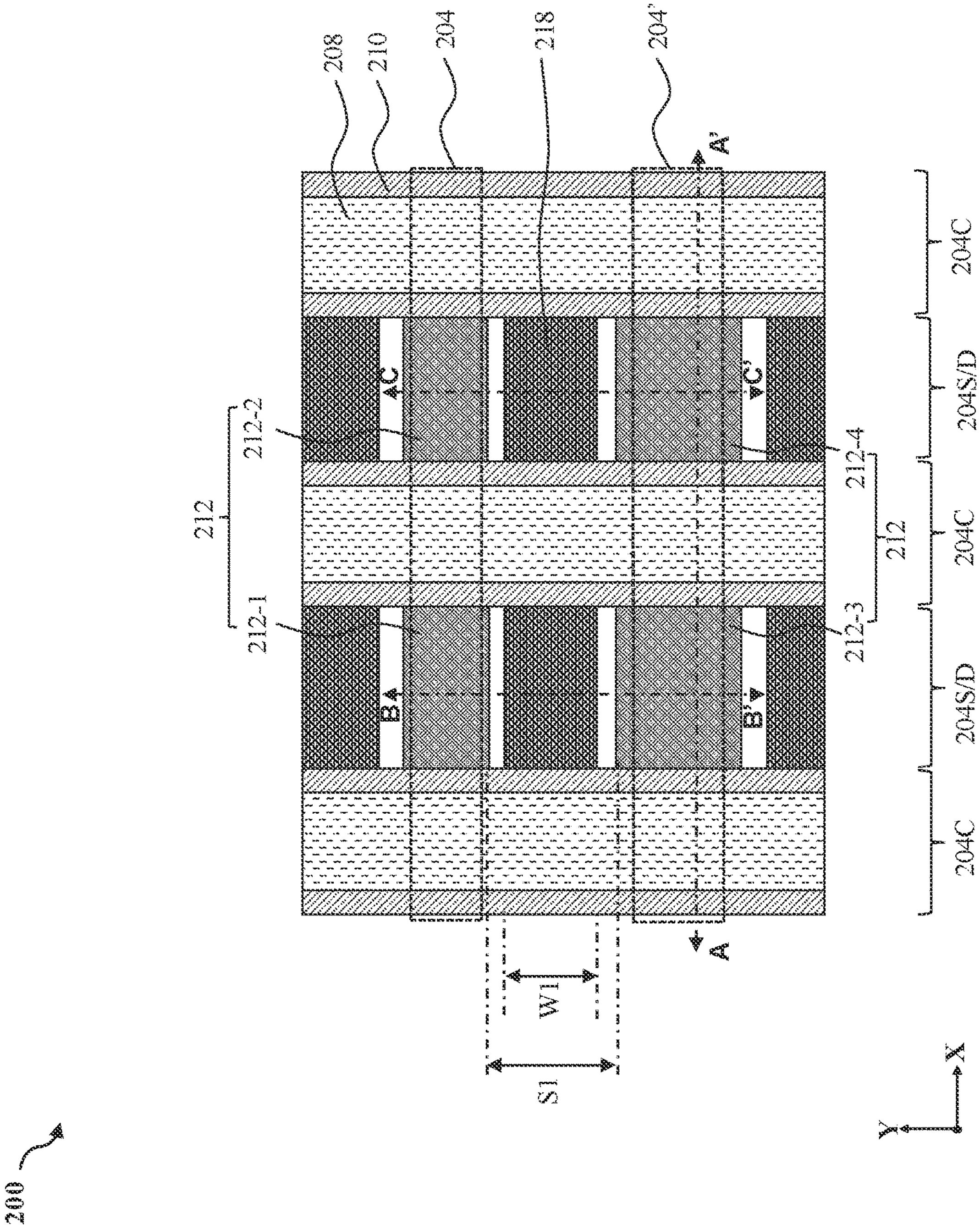
FIG. 2 depicts a fragmentary top view of an exemplary workpiece to undergo fabrication according to the method in FIG. 1, according to one or more aspects of the present disclosure.
Figure 3:
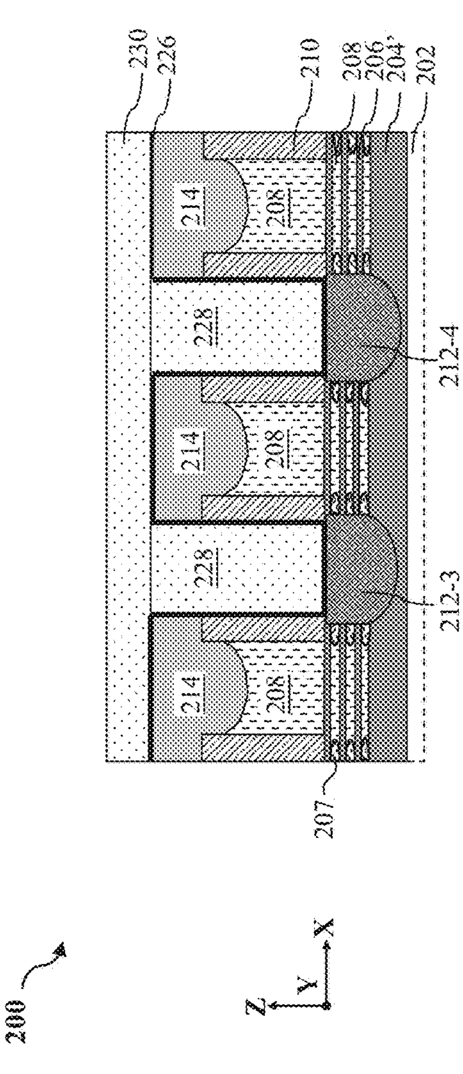
FIGS. 3-4, 6-19, 21-33 illustrate fragmentary cross-sectional views of an exemplary workpiece at various stages of fabrication according to the method in FIG. 1, according to one or more aspects of the present disclosure.
Figure 4:
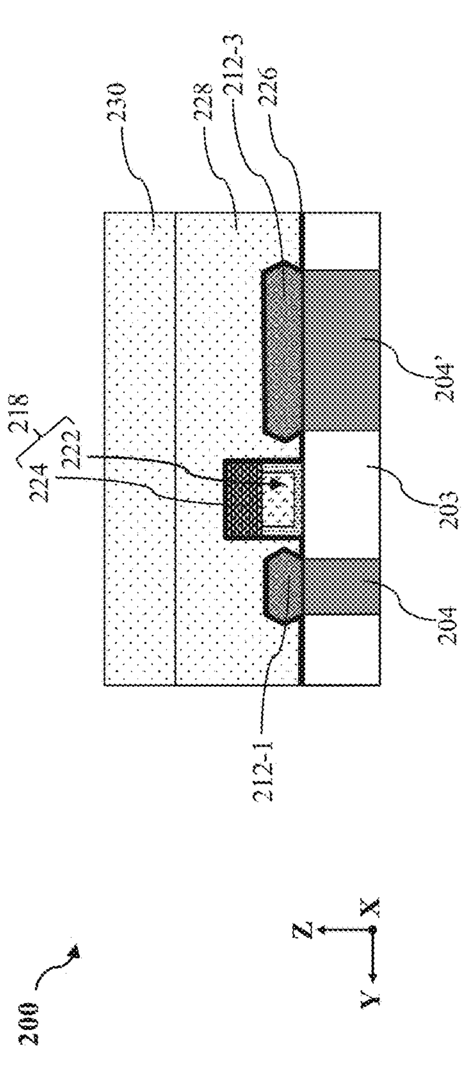

Referring to FIGS. 1, 2, 3, and 4, method 100 includes a block 102 where a workpiece 200 is received. FIG. 2 illustrates a fragmentary top view of the workpiece 200. FIG. 3 illustrates a fragmentary cross-sectional view of the workpiece 200 along line A-A' and FIG. 4 illustrates a fragmentary cross-sectional view of the workpiece 200 along line B-B'. As shown in FIG. 2, the workpiece 200 includes a first active region 204 and a second active region 204' over a substrate 202. In some embodiments, the substrate 202 may be a semiconductor substrate such as a silicon substrate. In some embodiments, the substrate 202 may also include other semiconductors such as germanium (Ge), silicon carbide (SiC), silicon germanium (SiGe), diamond, gallium arsenide (GaAs), gallium phosphide (GaP), indium phosphide (InP), indium arsenide (InAs), and/or indium antimonide (InSb), gallium arsenic phosphorus (GaAsP), aluminum indium arsenic (AlInAs), aluminum gallium arsenic (AlGaAs), indium gallium arsenic (InGaAs), gallium indium phosphorus (GaInP), and/or gallium indium arsenic phosphorus (GaInAsP), or combinations thereof. In some embodiments, the substrate 202 may include various doping configurations depending on design requirements as is known in the art. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

The first active region 204 and the second active region 204' may include a vertical stack of channel members in case of MBC transistors or may include a fin structure (i.e., a fin, or a fin element) in case of FinFETs. In the embodiments represented in FIG. 3, the semiconductor device 200 includes MBC transistors and each of the first active region 204 and the second active region 204' includes a vertical stack of channel members. As shown in FIG. 3, the second active region 204' includes a number of channel members 206 formed over the substrate 202. Each channel member 206 may include a semiconductor material such as, silicon, germanium, silicon carbide, silicon germanium, GeSn, SiGeSn, SiGeCSn, other suitable semiconductor materials, or combinations thereof. In one embodiment, each channel member 206 includes silicon. The workpiece 200 also includes inner spacer features 207 disposed between the two adjacent channel members 206. The inner spacer features 207 may include silicon nitride, silicon oxycarbonitride, silicon carbonitride, silicon oxide, silicon oxycarbide, silicon carbide, or silicon oxynitride. The channel members 206 and inner spacer features 207 are omitted in FIGS. 4-33 for reason of simplicity. In some other embodiments, each of the first active region 204 and the second active region 204' may be a fin structure and the semiconductor device 200 may include FinFETs. The first active region 204 and the second active region 204' may include silicon (Si) or another elementary semiconductor, such as germanium (Ge); a compound semiconductor such as silicon carbide (SiC), gallium arsenide (GaAs), gallium phosphide (GaP), indium phosphide (InP), indium arsenide (InAs), and/or indium antimonide (InSb); an alloy semiconductor such as silicon germanium (SiGe), gallium arsenic phosphorus (GaAsP), aluminum indium arsenic (AlInAs), aluminum gallium arsenic (AlGaAs), indium gallium arsenic (InGaAs), gallium indium phosphorus (GaInP), and/or gallium indium arsenic phosphorus (GaInAsP); or combinations thereof.

The first active region 204 and the second active region 204' may be fabricated using suitable processes including photolithography and etch processes. The photolithography process may include forming a photoresist layer overlying the substrate 202, exposing the photoresist layer to radiation reflected from or transmitting through a photomask, performing post-exposure bake processes, and developing the photoresist layer to form a masking element including the photoresist layer. In some embodiments, patterning the photoresist layer to form the masking element may be performed using an electron beam (e-beam) lithography process. The masking element may then be used to protect regions of the substrate 202 while an etch process forms recesses into the substrate 202, thereby forming the first active region 204 and the second active region 204'. The recesses may be etched using a dry etching (e.g., chemical oxide removal), a wet etching, and/or other suitable processes. Numerous other embodiments of methods to form the active regions 204 and 204' on the substrate 202 may also be used.

As shown in FIGS. 2-4, the first active region 204 and the second active region 204' extend lengthwise along the X direction. Active regions are separated from one another by an isolation feature 203 (shown in FIG. 4). The isolation feature 203 may also be referred to as the shallow trench isolation (STI) feature and may include silicon oxide, silicon nitride, silicon oxynitride, fluorine-doped silicate glass (FSG), a low-k dielectric, combinations thereof, and/or other suitable materials. The first active region 204 and the second active region 204' may have similar or different widths along the Y direction. In embodiment represented in FIG. 2, the second active region 204' has a width greater than a width of the first active region 204. The wider width of the second active region 204' may allow a transistor over the second active region 204' to have a greater On-state current and the smaller width of the first active region 204 may allow a transistor over the first active region 204 to have a smaller leakage. In the depicted embodiment, the spacing between the first active region 204 and the second active region 204' is referred to as S1. In some embodiments, the spacing S1 may be between about 20 nm and about 200 nm to suit various design needs. The spacing S1 may be made smaller than 20 nm when a more advanced photolithography technique (e.g., Extreme ultraviolet (EUV) photolithography) is used. To reduce production cost and avoid using the more advanced photolithography techniques, the spacing S1 may be greater than 20 nm.

Still referring to FIGS. 2, 3, and 4, the first active region 204 includes a channel region 204C disposed between a first source/drain region 204SD and a second source/drain region 204SD. A first source/drain feature 212-1 and a second source/drain feature 212-2 are formed over the first source/drain region 204SD and the second source/drain region 204SD, respectively. The second active region 204' includes a channel region 204C disposed between a third source/drain region 204SD and a fourth source/drain region 204SD. A third source/drain feature 212-3 and a fourth source/drain feature 212-4 are formed over the third source/drain region 204SD and the fourth source/drain region 204SD, respectively. The first, second, third and fourth source/drain features 212-1, 212-2, 212-3, and 212-4 may be collectively referred to as source/drain features 212.

Each channel region 204C is wrapped over by a gate structure 208. More specifically, in situations where the semiconductor device 200 includes MBC transistors, the gate structure 208 wraps around each of the channel members 206 and over the topmost channel member, as illustrated in FIG. 3. In situations where the semiconductor device 200 includes FinFETs, the gate structure 208 may be formed to wrap over a top surface and sidewalls of the fin. As illustrated in FIG. 2, the gate structure 208 extends lengthwise along Y direction, which is perpendicular to the X direction. While not explicitly shown in FIG. 2, the gate structure 208 includes an interfacial layer, a gate dielectric layer, one or more work function layers, and a metal fill layer. In some embodiments, the interfacial layer may include a dielectric material such as silicon oxide or silicon hafnium oxide. The gate dielectric layer is formed of a high-k (i.e., dielectric constant greater than about 3.9) dielectric material that may include hafnium oxide (HfO), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The one or more work function layers may include n-type work function layers and p-type work function layers. Exemplary n-type work function layers may be formed of aluminum, titanium aluminide, titanium aluminum carbide, tantalum silicon carbide, tantalum silicon aluminum, tantalum silicon carbide, tantalum silicide, or hafnium carbide. Exemplary p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co), nickel (Ni), or copper (Cu).

Sidewalls of the gate structure 208 are lined by a gate spacer 210. The gate spacer 210 separates the gate structure 208 from adjacent source/drain features. The gate spacer 210 shown in FIGS. 2 and 3 may be a single-layer structure or a multi-layer structure. Exemplary materials for the gate spacer 210 may include silicon oxide, silicon nitride, silicon carbide, silicon oxynitride, silicon carbonitride, silicon oxycarbide, silicon oxycarbonitride, and/or combinations thereof. In one example, the gate spacer 210 is formed of silicon nitride. As shown in FIG. 3, when viewed along the Y direction, each of the gate structures 208 and the gate spacers 210 sandwiching it are capped by a self-aligned capping (SAC) layer 214. The SAC layer 214 may be formed of hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In one embodiment, the SAC layer 214 is formed of silicon nitride.

The source/drain features 212 shown in FIGS. 2-4 may be epitaxially grown over the source/drain regions 204SD of the corresponding active regions such as the first active region 204 and the second active region 204'. Depending on the device types and design requirements, the source/drain features of the present disclosure may be n-type or p-type. For example, n-type source/drain features may include silicon (Si) doped with an n-type dopant, such as phosphorous (P) or arsenic (As) and p-type source/drain features may include silicon germanium (SiGe) doped with a p-type dopant, such as boron (B), boron difluoride ($BF_2$), or gallium (Ga). In some embodiments represented in FIGS. 2-4, since the first active region 204 and the second active region 204' may have different widths along the Y direction, the source/drain features formed over the first active region 204 and the second active region 204' may have different widths along the Y direction. In this embodiment, the width of the third source/drain feature 212-3 is wider than the first source/drain feature 212-1 along the Y direction.

Referring to FIGS. 2 and 4, a dielectric fin 218 is disposed between the first active region 204 and the second active region 204' and extends lengthwise along the X direction. The dielectric fin 218 is disposed between the first source/drain feature 212-1 and the third source/drain feature 212-3 and also disposed between the second source/drain feature 212-2 and the fourth source/drain feature 212-4. The dielectric fin 218 may be configured to prevent merging of two adjacent source/drain features during their epitaxial growth.

In some embodiments represented in FIG. 4, the dielectric fin 218 includes a first portion 222 and a second portion 224 over the first portion 222. The first portion 222 and the second portion 224 may have different compositions. A dielectric constant of the second portion 224 may be greater than a dielectric constant of the first portion 222. In some instances, the first portion 222 may include silicon oxide, silicon oxycarbonitride or silicon carbonitride and the second portion 224 may include silicon nitride, aluminum oxide, zirconium oxide, hafnium oxide, a metal oxide, or a suitable dielectric material. The first portion 222 and/or the second portion 224 may be a single-layer structure or a multi-layer structure. For example, as shown in FIG. 4, the first portion 222 is a two-layer structure and having an inner layer with its bottom surface and sidewalls lined by an outer layer. As shown in FIG. 4, a top surface of the dielectric fin 218 is higher than top surfaces of the first source/drain feature 212-1 and the third source/drain feature 212-3 along the Z direction. In some embodiments, the dielectric fin 218 may have a width W1 (along the Y direction, shown in FIG. 2) that is between about 5 nm and about 180 nm to prevent merging of two adjacent source/drain features (such as the first source/drain feature 212-1 and the third source/drain feature 212-3) and to achieve satisfactory densely spaced MEOL features. In an embodiment, W1 may be between about 5 nm and about 30 nm to prevent merging of two adjacent source/drain features while providing desired density.

Still referring to FIGS. 2 and 4, the workpiece 200 also includes a contact etch stop layer (CESL) 226 over the source/drain features 212, a first interlayer dielectric (ILD) layer 228 over the CESL 226, and a second ILD layer 230 over the first ILD layer 228. As shown in FIGS. 3 and 4, the CESL 226 is in contact with the top surfaces of source/drain features 212, sidewalls of the gate spacers 210, and a top surface and sidewalls of the SAC layer 214. The CESL 226 may include a nitrogen-containing dielectric material. In some instances, the CESL 226 may include silicon nitride or silicon carbonitride. The first ILD layer 228 and the second ILD layer 230 may have the same composition and may include silicon oxide or a low-k dielectric material with a k-value (dielectric constant) smaller than that of silicon oxide, which is about 3.9. In some examples, the low-k dielectric material such as tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

Figure 5:
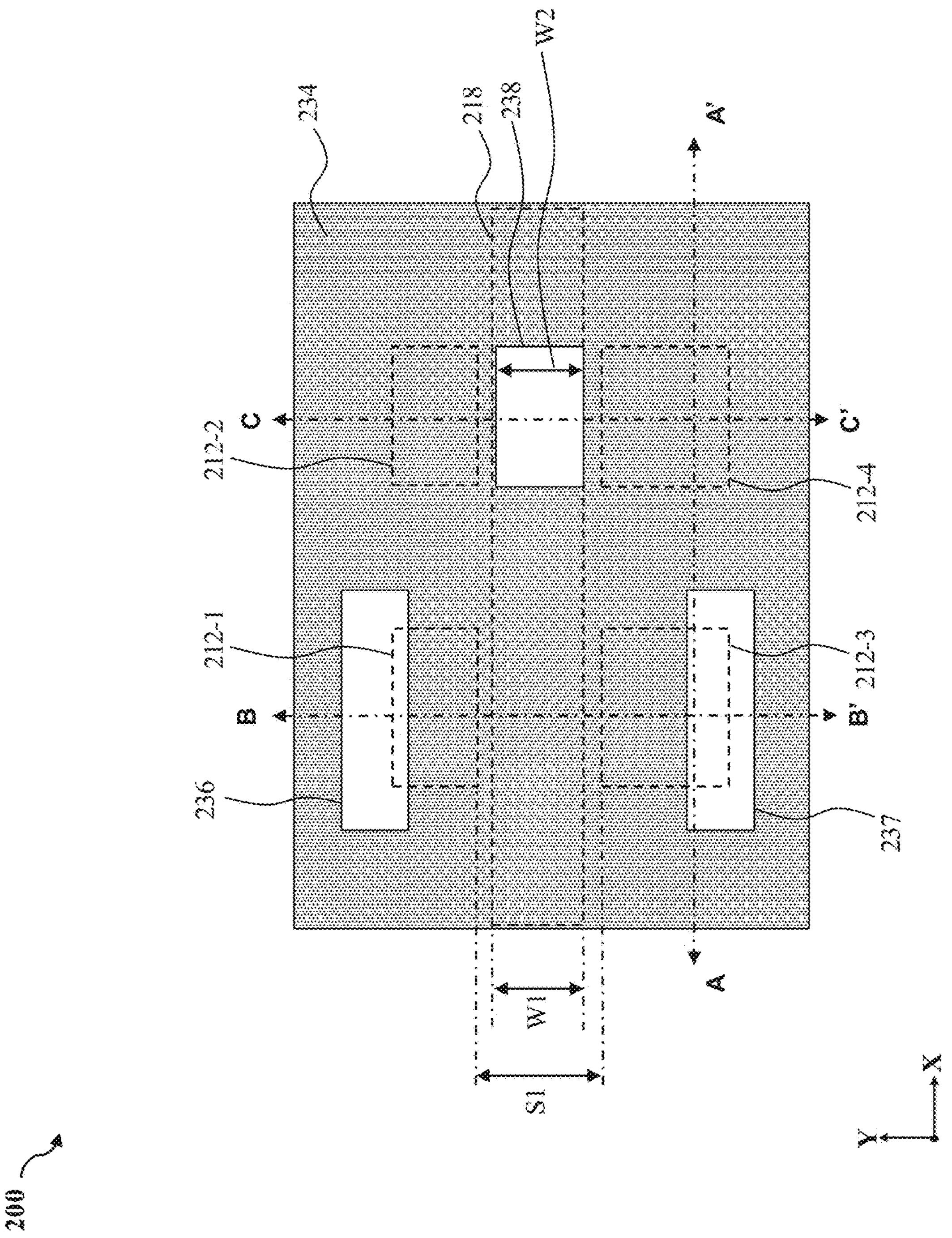
FIGS. 5 and 20 depict fragmentary top views of an exemplary workpiece at various stages of fabrication according to the method in FIG. 1, according to one or more aspects of the present disclosure.
Figure 6:
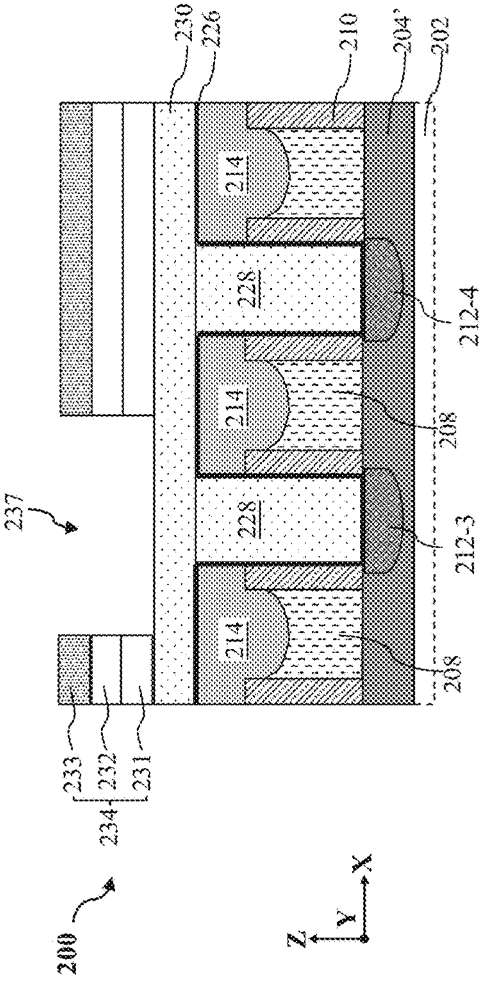
Figure 7:
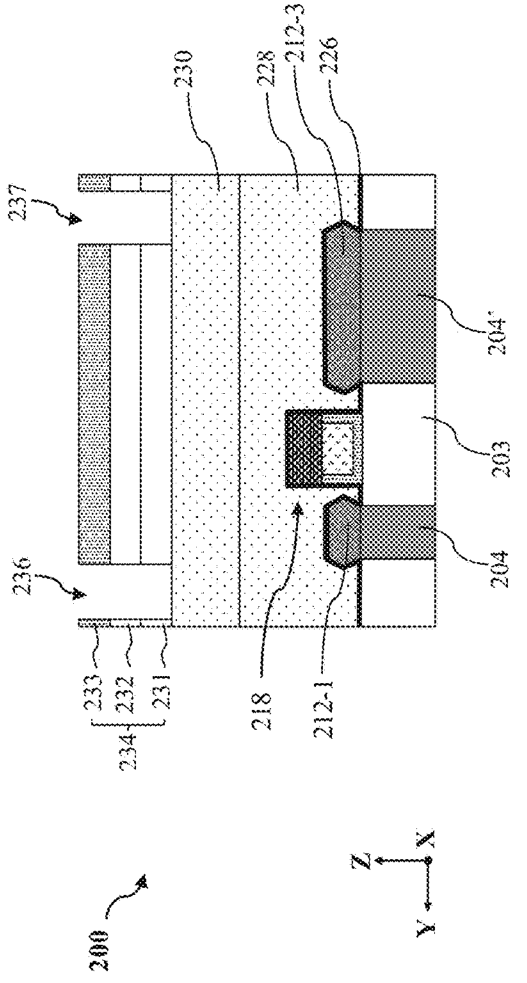

Now referring to FIGS. 1, 5, 6, and 7, method 100 includes a block 104 where a patterned photoresist layer 234 is formed over the workpiece 200. FIG. 5 illustrates a fragmentary top view of the workpiece 200. FIG. 6 illustrates a fragmentary cross-sectional view of the workpiece 200 along line A-A' and FIG. 7 illustrates a fragmentary cross-sectional view of the workpiece 200 along line B-B'. The photoresist layer 234 may be a single-layer structure or a multi-layer structure. In embodiments represented in FIGS. 6 and 7, the photoresist layer 234 is a tri-layer structure and includes a bottom layer 231, a middle layer 232 over the bottom layer 231, and a top layer 233 over the middle layer 232. In one embodiment, the bottom layer 231 may be a carbon-rich polymer layer, the middle layer 232 may be a silicon-rich polymer layer, and the top layer 233 may be photosensitive polymer layer. The top layer 233 is first exposed to a radiation reflected from or transmitting through a photomask, baked in a post-exposure bake process, developed in a development process, and rinsed. The pattern of photomask is thereby transferred to the top layer 233 to form a patterned top layer 233 that includes openings 236, 237, and 238, as shown in FIGS. 5, 6 and 7. The patterned top layer 233 is used as an etch mask to etch the middle layer 232 and the bottom layer 231. In some embodiments, a hard mask layer may be deposited between the second ILD layer 230 and the photoresist layer 234 and patterned by using the patterned photoresist layer 234 as an etch mask.

As shown in FIG. 5, the patterned photoresist layer 234 includes openings 236, 237, and 238 configured to expose regions to be removed to form cut feature openings for accommodating hybrid cut features. It is understood that the photoresist layer 234 may be patterned to have a different number of openings with different shapes and/or different dimensions. In embodiments represented in FIG. 6, a fragmentary cross-sectional view of the workpiece 200 along line A-A', the opening 237 is directly over the third source/drain feature 212-3 and spans a width (along the X direction) that is greater than the third source/drain feature 212-3. That is, portions of the opening 237 vertically overlap the gate spacers 210 and the SAC layer 214. As shown in FIG. 5, the opening 236 may have similar configuration as the opening 237 and may expose the first source/drain feature 212-1, adjacent gate spacers 210 and the SAC layer 214. The opening 238 is formed directly over the dielectric fin 218. In this depicted example, a width W2 of the opening 238 along the Y direction is substantially equal to the width W1 of the dielectric fin 218 to facilitate the formation of a satisfactory cut feature opening directly over the dielectric fin 218. That is, W2=W1. In some other implementations, to fulfill different design requirements, the width W2 of the opening 238 may be greater or smaller than the width W1 of the dielectric fin 218.

Figure 8:
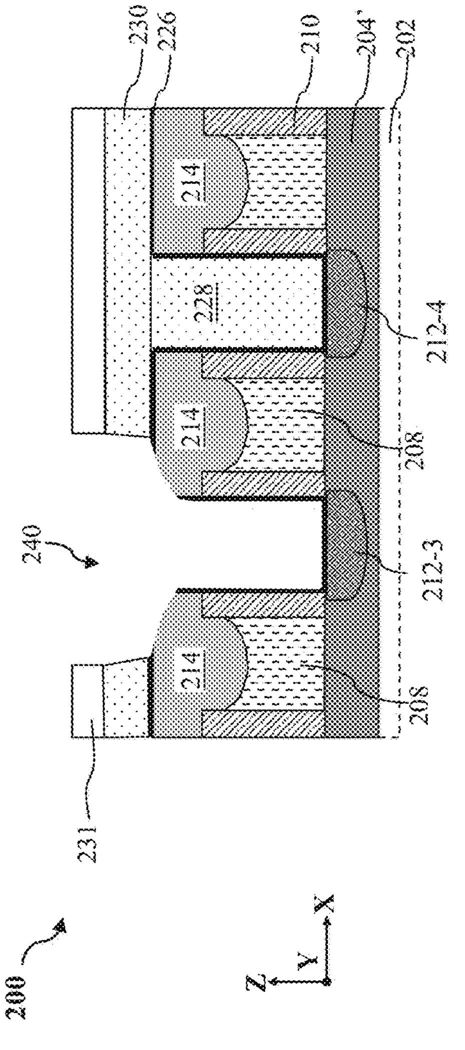
Figure 9:
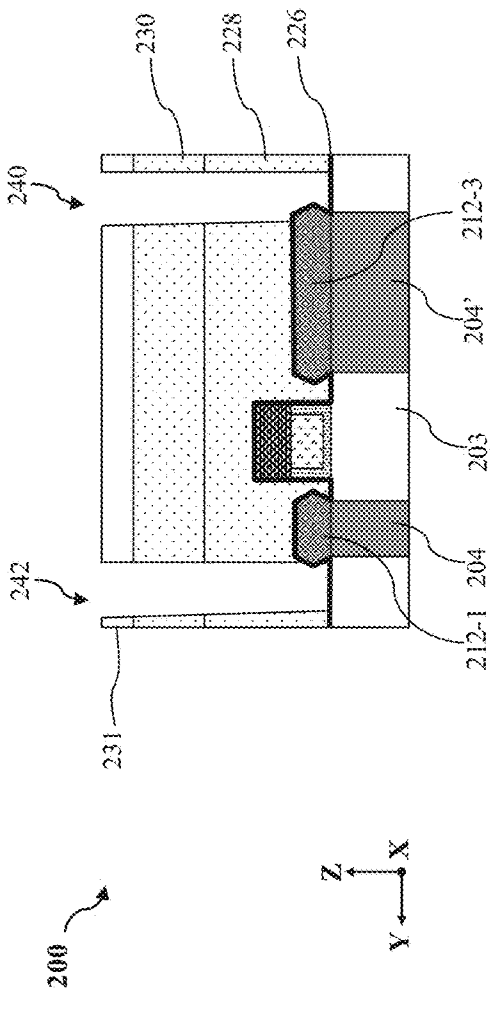

Referring to FIGS. 1, 8, and 9, method 100 includes a block 106 where a first etching process is performed to the workpiece 200 to form cut feature openings such as cut feature openings 240 and 242. FIG. 8 illustrates a fragmentary cross-sectional view of the workpiece 200 along line A-A' and FIG. 9 illustrates a fragmentary cross-sectional view of the workpiece 200 along line B-B'. As shown in FIGS. 8-9, with the patterned bottom layer 231 in place, the first etching process is performed to etch the second ILD layer 230 and the first ILD layer 228 to form cut feature openings 240 and 242. Although a cross-sectional view of the workpiece 200 along line C-C' is omitted for reason of simplicity, it is understood that, due to the formation of the opening 238 and the performing of the first etching process, a cut feature opening would be formed under the opening 238.

In some embodiments, the first etching process may include one or more etching processes configured to selectively remove the second ILD layer 230 exposed by the openings 236, 237, and 238 and the first ILD layer 228 under the exposed second ILD layer 230 without substantially etching the SAC layer 214 and the CESL 226. In some embodiments, as shown in FIG. 8, the upper corners of the SAC layer 214 and the CESL 226 that face the opening 237 may become rounded as a result of the first etching process. In embodiments shown in FIG. 8, along the X direction, after the performing of the first etching process, cut feature openings 240 and 242 are formed, which have the CESL 226 as their bottom and sidewall surfaces. As shown in FIG. 9, along the Y direction, the cut feature openings 240 and 242 have the ILD layers 228 and 230 as their sidewall surfaces and are directly over a portion of the corresponding source/drain features 212-1 and 212-3. In the depicted embodiment shown in FIG. 9, the cut feature openings 240 and 242 each have a tapered side profile. The patterned photoresist layer 234 (e.g., including the bottom layer 231) may be selectively removed after forming the cut feature openings 240 and 242.

Figure 10:
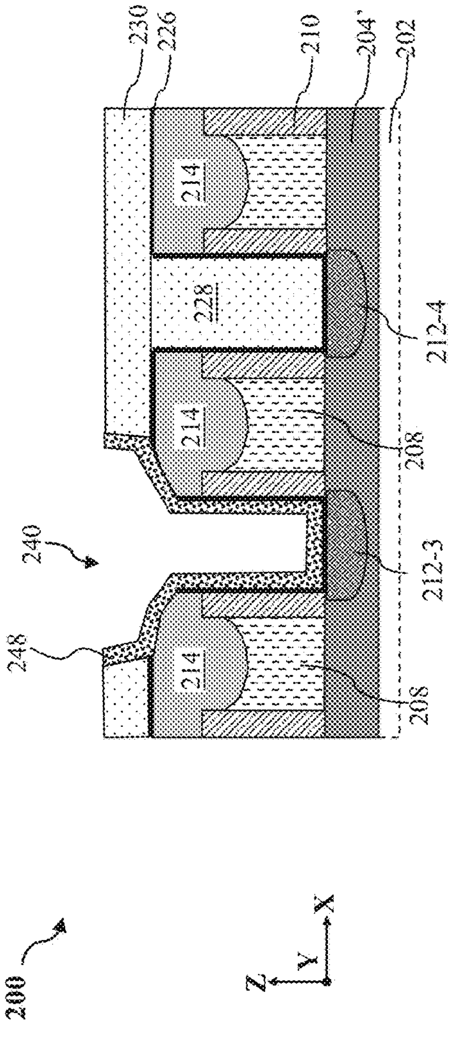
Figure 11:
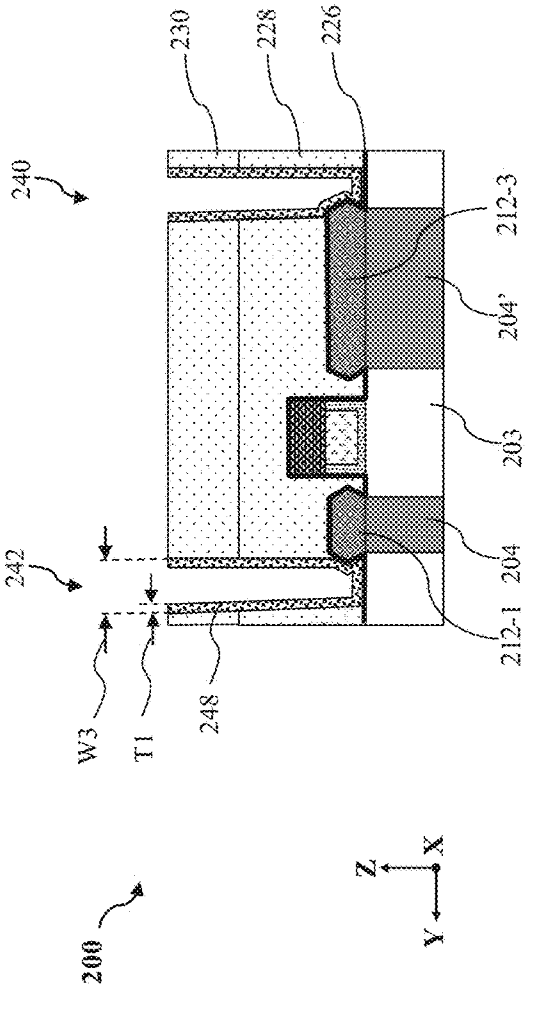

Referring to FIGS. 1, 10, and 11, method 100 includes a block 108 where a dielectric liner 248 of a hybrid cut feature 252 is conformally deposited over the workpiece 200 and in the cut feature openings (such as the cut feature openings 240 and 242). FIG. 10 illustrates a fragmentary cross-sectional view of the workpiece 200 along line A-A' and FIG. 11 illustrates a fragmentary cross-sectional view of the workpiece 200 along line B-B'. The cut feature opening 240/242 includes a width W3 along the Y direction. The dielectric liner 248 is conformally deposited to have a generally uniform thickness T1 over the top surface of the workpiece 200 (e.g., having substantially the same thickness on top surfaces and/or sidewall surfaces of the CESL 226, the SAC layer 214, and the first ILD layer 228 and the second ILD layer 230 exposed by the cut feature opening 240/242) and partially fills the cut feature openings 240 and 242. The dielectric liner 248 tracks the shape of the cut feature openings 240 and 242. In embodiments represented in FIG. 10, a portion of the dielectric liner 248 is formed directly on the CESL 226 and a portion of the dielectric liner 248 is formed directly on the rounded portion of the SAC layer 214. That is, the dielectric liner 248 is spaced apart from the gate spacer 210 and the third source/drain feature 212-3 by the CESL 226, and in direct contact with the rounded portion of the SAC layer 214. In embodiments represented in FIG. 11, the dielectric liner 248 is spaced apart from the isolation feature 203 and the source/drain features 212-1 and 212-3 by the CESL 226 and in direct contact with the first and second ILD layers 228 and 230.

In this depicted example, the dielectric liner 248, the first ILD layer 228, and the second ILD layer 230 have the same composition such that at least a portion of the dielectric liner 248 would be selectively removed together with the first ILD layer 228/second ILD layer 230 in a subsequent etching process (e.g., a second etching process described with reference to FIGS. 17-18). For example, the dielectric liner 248 and the first ILD layer 228/second ILD layer 230 may be both formed of silicon oxide. In some embodiments, due to the dimension of the cut feature opening 240/242, the dielectric liner 248 may be formed by performing a deposition process such as an ALD process or other suitable deposition processes while the second ILD layer 230 may be formed by FCVD or other suitable deposition processes. In an embodiment, a ratio of the thickness T1 of the dielectric liner 248 to the width W3 of the hybrid cut feature opening 240 (i.e., T1/W3) may be between about 0.005 and about 0.45, to efficiently reduce a dimension of the hybrid cut feature 252 and thus efficiently reduce a spacing between two adjacent contact features while providing satisfactory isolation between the two adjacent contact features in the final structure. In some embodiments, the width W3 may be between about 5 nm and about 100 nm to facilitate the formation of the satisfactory hybrid cut feature 252 with existing photolithography techniques. In an embodiment, the width W3 is between about 5 nm and about 30 nm to form the satisfactory hybrid cut feature while achieving desired density. In some embodiments, the thickness T1 may be between about 0.5 nm and about 10 nm such that the spacing between two adjacent contact features are reduced without significantly reducing the dimension of the to-be-formed dielectric filler 250.

Figure 12:
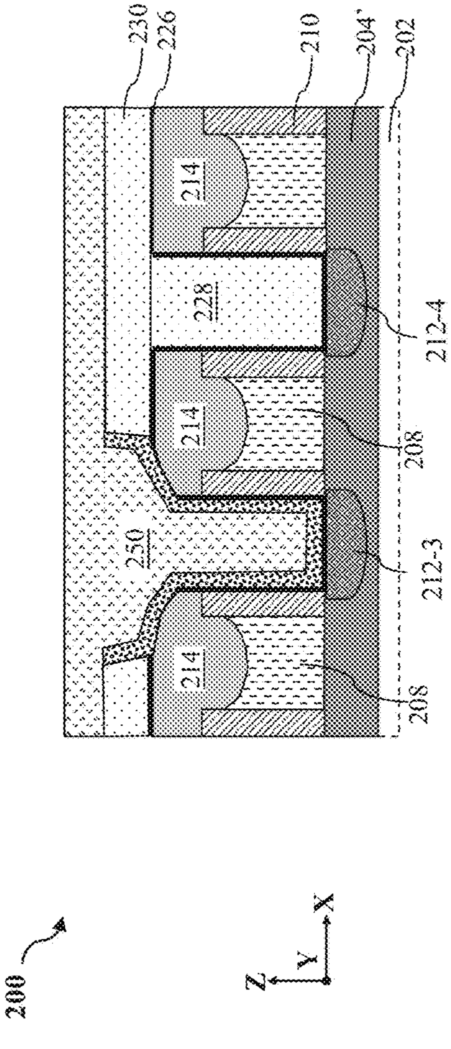
Figure 13:
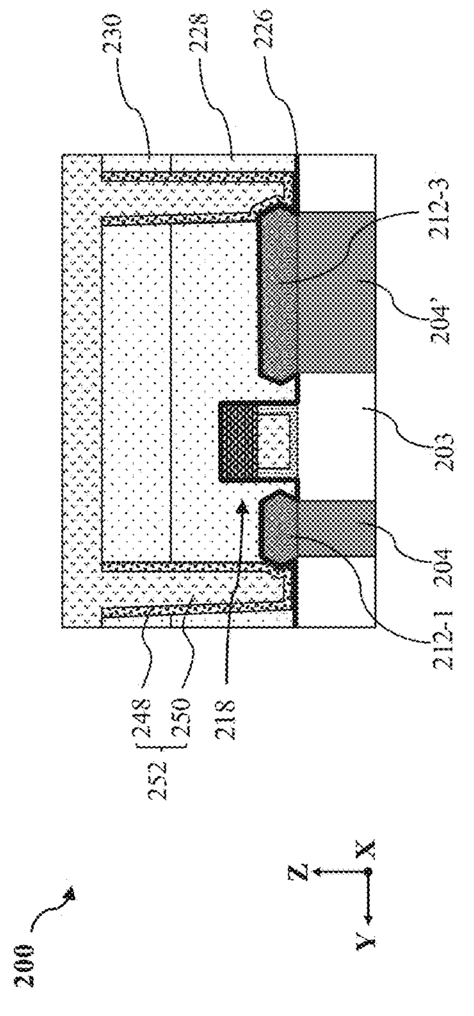

Referring to FIGS. 1, 12, and 13, method 100 includes a block 110 where a dielectric filler 250 of the hybrid cut feature 252 is deposited over the dielectric liner 248 to fill the cut feature openings (e.g., cut feature openings 240 and 242). FIG. 12 illustrates a fragmentary cross-sectional view of the workpiece 200 along line A-A' and FIG. 13 illustrates a fragmentary cross-sectional view of the workpiece 200 along line B-B'. The dielectric filler 250 may be deposited over the workpiece 200 using CVD, SACVD, FCVD, ALD, spin-on coating, and/or other suitable process. The composition of the dielectric filler 250 is selected such that there is an etch selectivity between the dielectric filler 250 and the second ILD layer 230 and between the dielectric filler 250 and the dielectric liner 248. More specifically, the dielectric filler 250 is more etch-resistant than the dielectric liner 248 and the second ILD layer 230 with respect to a second etching process to be described with reference to FIG. 18. The dielectric filler 250 may include silicon, silicon nitride, silicon carbide, silicon oxynitride, silicon oxycarbonitride, silicon carbonitride, aluminum oxide, hafnium oxide, a combination thereof, or other suitable materials. In one embodiment, the dielectric filler 250 is formed of silicon oxynitride or silicon oxycarbonitride. In some embodiments, a composition of the dielectric filler 250 is same to a composition of the CESL 226.

Figure 14:
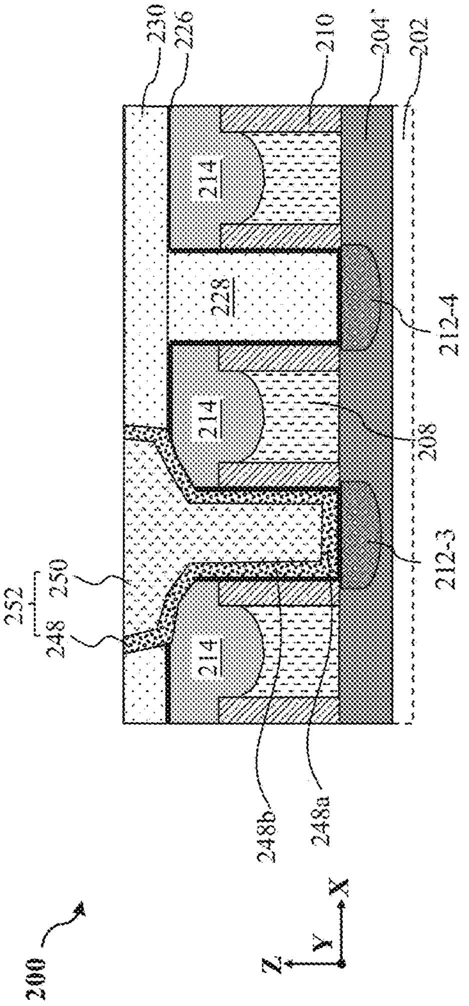
Figure 15:
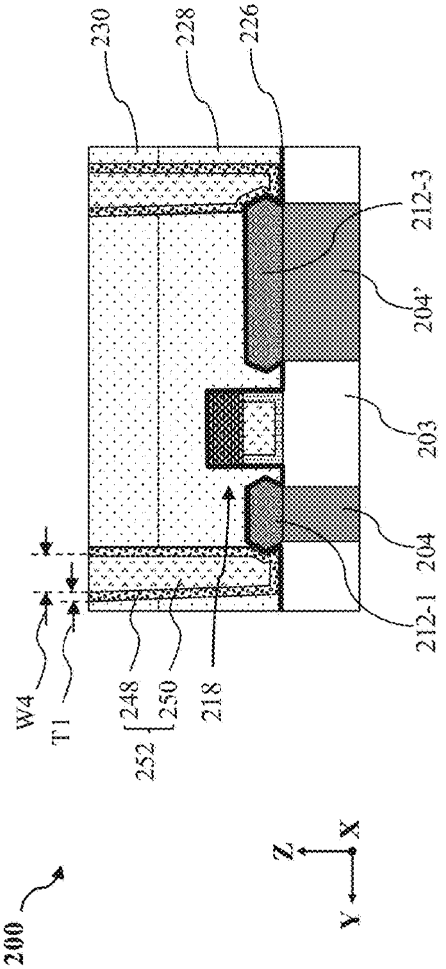
Figure 16:
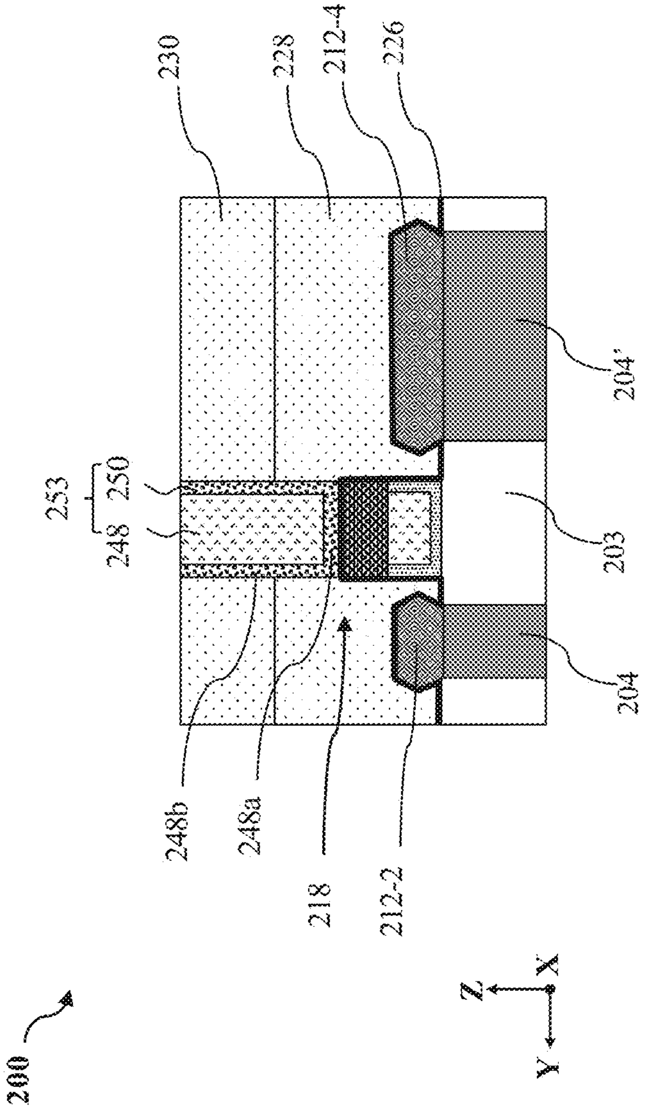

As shown in FIGS. 14-16, after the deposition of the dielectric filler 250, a planarization process, such as a chemical mechanical polishing (CMP) process, is performed to planarize the workpiece 200 to remove excess materials and expose a top surface of the second ILD layer 230. The dielectric liner 248 and the dielectric filler 250 may be collectively referred to as the hybrid cut feature 252. FIG. 14 illustrates a fragmentary cross-sectional view of the workpiece 200 along line A-A'. In embodiments represented in FIG. 14, the hybrid cut feature 252 is spaced apart from the gate spacers 210 and the third source/drain feature 212-3 by the CESL 226, and the dielectric filler 250 is spaced apart from the CESL 226 by the dielectric liner 248. It is noted that, the dielectric filler 250 is spaced apart from a portion (e.g., the rounded portion) of the SAC layer 214 only by the dielectric liner 248 and is spaced apart from another portion of the SAC layer 214 by both the dielectric liner 248 and the CESL 226. As shown in FIG. 14, the hybrid cut feature 252 rises above top surfaces of the SAC layers 214.

FIG. 15 illustrates a fragmentary cross-sectional view of the workpiece 200 along line B-B'. As shown in FIG. 15, a top surface of the hybrid cut feature 252 is higher than a top surface of the dielectric fin 218 and is coplanar with a top surface of the second ILD layer 230. The dielectric filler 250 has a width W4 along the Y direction. Given a fixed width W3, W4 is inversely related to the thickness T1 of the dielectric liner 248. More specifically, W4=W3−2*T1. In an embodiment, a ratio of the width W4 of the dielectric filler 250 to the width W3 of the cut feature opening 242 (i.e., W4/W3) may be between about 0.1 and about 0.99 to provide a satisfactory isolation between the to-be-formed contact features while significantly reducing the distance between the to-be-formed contact features. In an embodiment, a ratio of the width W4 to the thickness T1 of the dielectric liner 248 (i.e., W4/T1) may be between about 0.2 and about 198 such that the hybrid cut feature would provide a satisfactory isolation. In an embodiment, a ratio of W4 to T1 (i.e., W4/T1) may be between about 0.2 and about 10 to ensure that the hybrid cut feature would provide the satisfactory isolation after the performing of the second etching process while also efficiently reducing the distance between the to-be-formed contact features. As depicted herein, the dielectric filler 250 is separated from the CESL 226 and the first/second ILD layer 228/230 by the dielectric liner 248.

FIG. 16 illustrates a fragmentary cross-sectional view of the workpiece 200 along line C-C' (line C-C' is shown in FIG. 5). As described above with reference to FIG. 5, the patterned photoresist layer 234 includes an opening 238. By implementing the processes in blocks 106, 108, 110, and 112 described with references to FIGS. 6-15, a hybrid cut feature 253 is formed directly over the dielectric fin 218 disposed between the second source/drain feature 212-2 and the fourth source/drain feature 212-4. In embodiments represented in FIG. 16, a width of the hybrid cut feature 253 is substantially equal to the width W1 of the dielectric fin 218. It is understood that, to fulfill different design requirements, the width of the hybrid cut feature 253 may be greater than or smaller than the width W1 of the dielectric fin 218. The hybrid cut feature 253 is spaced apart from the dielectric fin 218 by the CESL 226. Sidewalls of the hybrid cut feature 253 are in direct contact with the first/second ILD layer 228/230. The dielectric liner 248 includes a first portion 248*a* (shown in FIG. 16) disposed directly under the dielectric filler 250 and a second portion 248*b* (shown in FIG. 16) extending along sidewalls of the dielectric filler 250.

Referring to FIGS. 1, 17-19 and 20-23, method 100 includes a block 112 where a second etching process is performed to the workpiece 200 to form a number of contact openings such as contact openings 260, 262 and 264. The first ILD layer 228 and the second ILD layer 230 are selectively removed by the second etching process to expose the source/drain features 212. Due to the etch selectivity between the dielectric filler 250 and the first ILD layer 228/second ILD layer 230, photolithography process may be omitted during the operations in block 112. Portions of the CESL 226 over the source/drain features 212 are also removed by the second etching process. In some embodiments, the second etching process may include one or more etching processes. For example, a primary etching process is first performed to selectively remove the first ILD layer 228 and the second ILD layer 230, and an additional etching process may be followed to break through the CESL 226 to expose the source/drain features 212. The second etching process used at block 112 may include dry etching process and may implement oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 17:
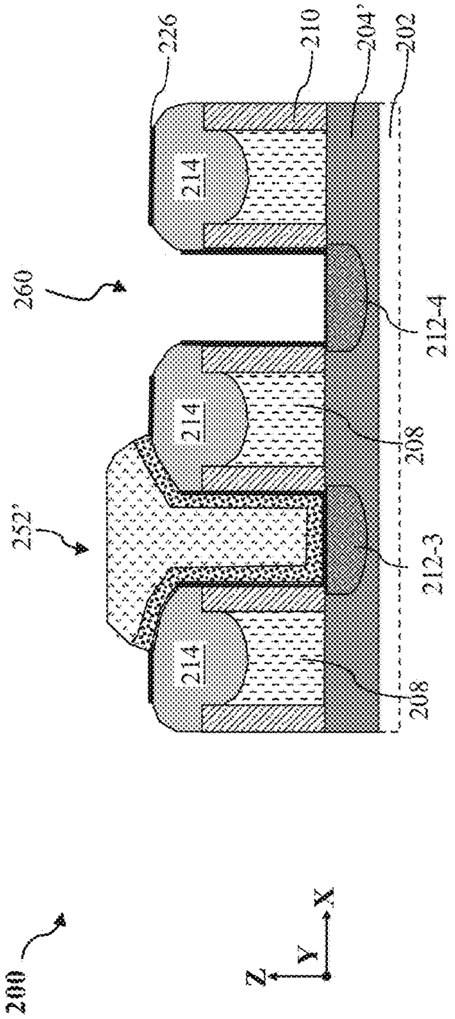

FIG. 17 illustrates a fragmentary cross-sectional view of the workpiece 200 along line A-A'. As shown in FIG. 17, the contact opening 260 exposes the fourth source/drain feature 212-4. A portion of the CESL 226 on the fourth source/drain feature 212-4 is removed, and the rest of the CESL 226 extends along the sidewalls of the adjacent gate spacers 210 and the SAC layers 214. The hybrid cut feature 252 is slightly etched during the second etching process. In embodiments represented in FIG. 17, a portion of the hybrid cut feature 252 extends over top surfaces of adjacent SAC layers 214. That is, top surfaces of the hybrid cut feature 252 are higher than top surfaces of the SAC layer 214 to ensure that the hybrid cut feature 252 function to divide the source/drain contacts into segments.

Figure 18:
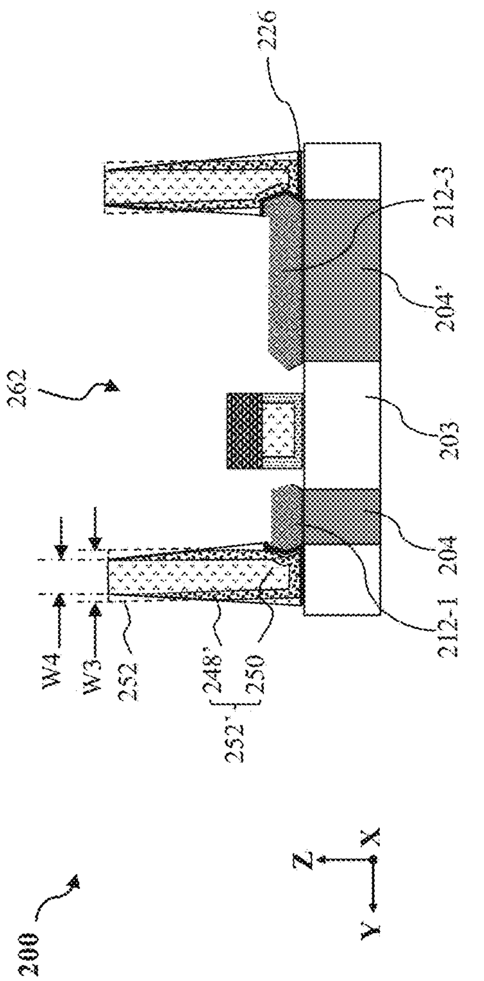

FIG. 18 illustrates a fragmentary cross-sectional view of a first exemplary embodiment of the workpiece 200 along line B-B'. The second etching process at block 112 is selective to the first ILD layer 228, the second ILD layer 230, and the dielectric liner 248 and etches the source/drain features 212 and the dielectric filler 250 of the hybrid cut features 252-253 at a slower rate. During the second etching process, a portion of the dielectric liner 248 extending along a sidewall of a top portion of the dielectric filler 250 is selectively removed. Due to the partial removal of the top portion of the dielectric liner 248, the dimension of the hybrid cut feature 252 is reduced. The hybrid cut feature 252 after the second etching process may be referred to as hybrid cut feature 252' and the hybrid cut feature 253 after the second etching process may be referred to as hybrid cut feature 253', and each include the rest of the dielectric liner 248 (may be referred to as dielectric liner 248') and the substantially undamaged dielectric filler 250. As the width W4 of a top surface of the hybrid cut feature 252' is smaller than the width W3 of a top surface of the hybrid cut feature 252, the contact opening 262 is enlarged and a distance between two adjacent contact openings is thus reduced, compared to embodiments where no dielectric liner 248 is formed and removed. In embodiments represented in FIG. 18, at the conclusion of the operations at block 112, a portion of the first source/drain feature 212-1, a portion of the third source/drain feature 212-3, and the dielectric fin 218 are exposed in the contact opening 262. The contact opening 262 may have a tapered side profile and further expose sidewalls of an upper portion of the dielectric filler 250, sidewalls of an upper portion of the dielectric liner 248', and a portion of the first ILD layer 228.

Figure 19:
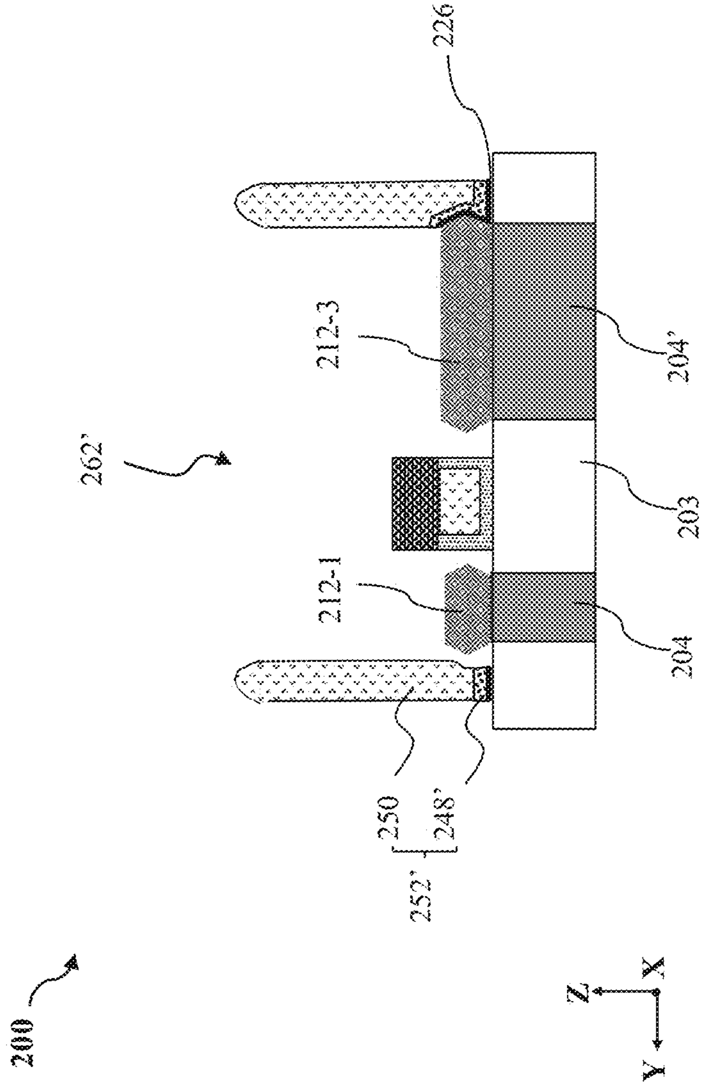

FIG. 19 illustrates a fragmentary cross-sectional view of an alternative embodiment of the workpiece 200 along line B-B'. In this alternative embodiment, the vertical portion of the dielectric liner 248 extending along the sidewall of the dielectric filler 250 is substantially removed, and the contact opening 262' is larger than the contact opening 262. As exemplary shown in FIG. 19, the dielectric liner 248' is fully covered by the dielectric filler 250 and is sandwiched between the dielectric filler 250 and the CESL 226. The dielectric filler 250 overhangs the dielectric liner 248'. More specifically, the width W4 of the dielectric filler 250 is greater than a width of the dielectric liner 248', and a portion of the dielectric filler 250 fully covers the dielectric liner 248'.

Figure 20:
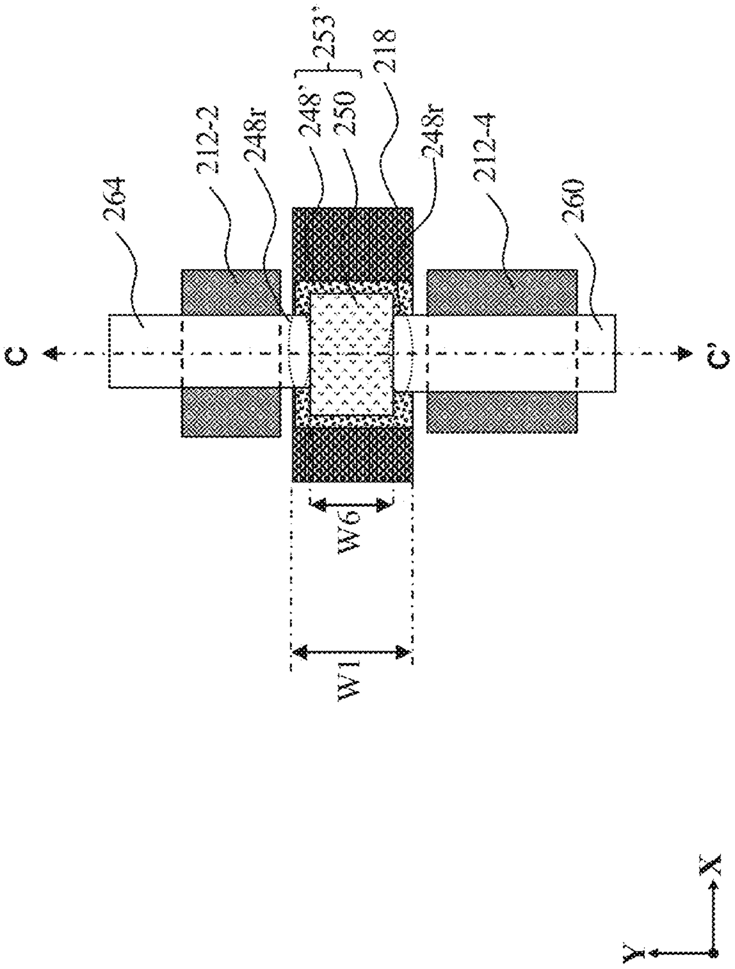

FIG. 20 illustrates a fragmentary top view of the workpiece 200. As shown in FIG. 20, the second source/drain feature 212-2 is partially exposed by the contact opening 264 and the fourth source/drain feature 212-4 is partially exposed by the contact opening 260. The contact openings 260 and 264 are spaced apart by the hybrid cut feature 253' and the dielectric fin 218. As shown in FIG. 20, to form the contact openings 260 and 264, a portion 248*r* of the dielectric liner 248 is removed by the second etching process. Due to the removal of the portion 248*r*, the distance W6 (substantially equal to the width of the dielectric filler 250) between the contact opening 260 and contact opening 264 is smaller than the width W1, as referenced in FIG. 20. Thus, a spacing between two adjacent to-be-formed contact features in the contact opening 260 and contact opening 264 may be advantageously reduced, leading to densely spaced contact features in the Y direction.

Figure 21:
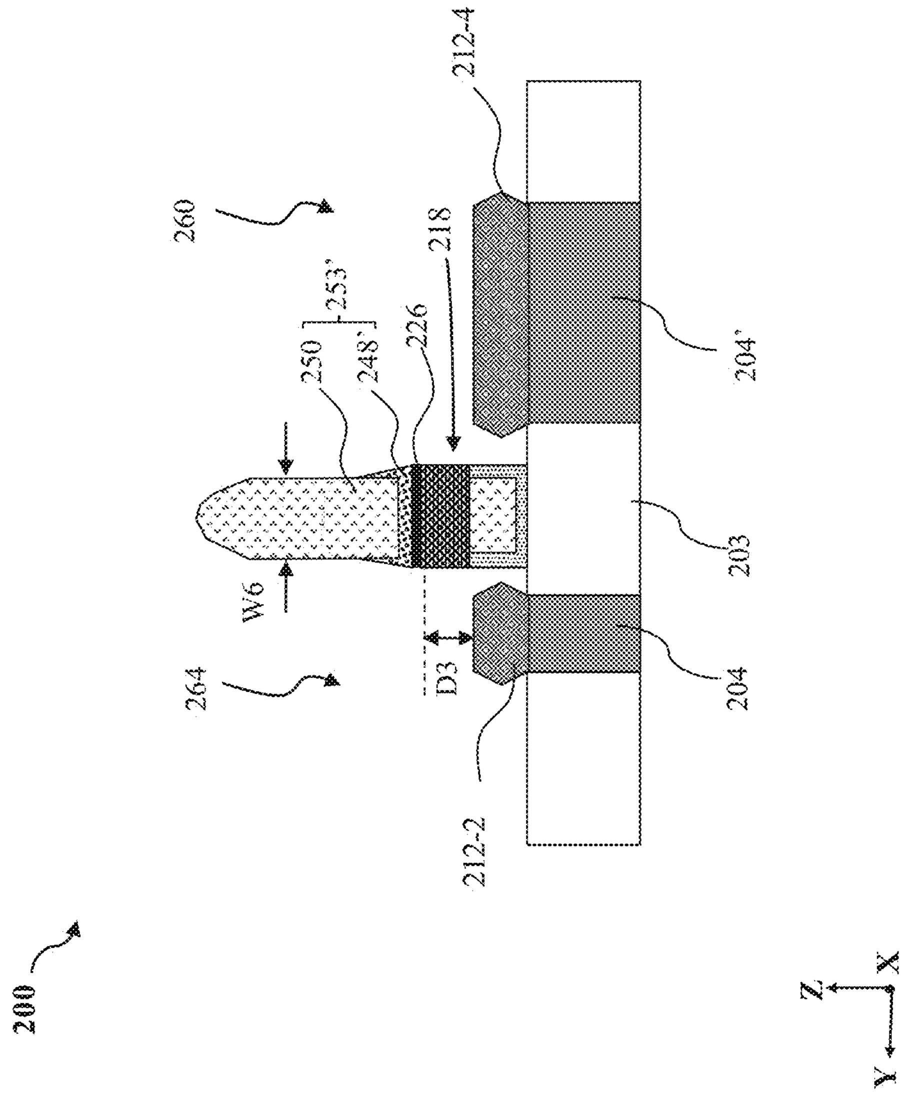

FIG. 21 illustrates a fragmentary cross-sectional view of a first exemplary embodiment of the workpiece 200 along line C-C' shown in FIG. 20. The hybrid cut feature 253' is disposed directly over the dielectric fin 218. More specifically, the hybrid cut feature 253' is spaced apart from the dielectric fin 218 only by the CESL 226. A width W6 of the hybrid cut feature 253' may be between about 5 nm and about 100 nm to be integrated into existing technologies for manufacturing the semiconductor device 200. In an embodiment, the width W6 may be between about 5 nm and about 30 nm to achieve satisfactory densely spaced source/drain contacts while preventing merging of two adjacent source/drain contacts. In an embodiment, a vertical distance D3 between the source/drain features (such as the second source/drain feature 212-2) and the hybrid cut feature 253' may be less than about 25 nm to be readily integrated into existing semiconductor fabrication processes.

As described above with reference to FIGS. 18 and 20, after the second etching process, a portion of the dielectric liner 248 is selectively removed, leaving the dielectric liner 248'. In embodiments represented in FIG. 21, after the second etching process, the dielectric liner 248' has a first portion disposed directly under the dielectric filler 250 and a second portion extending along sidewalls of a bottom portion of the dielectric filler 250. The CESL 226 is sandwiched between the hybrid cut feature 253' and the dielectric fin 218. In some embodiments, to form satisfactory source/drain contacts, the vertical portion of the dielectric liner 248' extending along the sidewalls of the bottom portion of the dielectric filler 250 may be substantially completely removed. For example, a third etching process may be performed after the second etching process. Various parameters of the second etching process and third etching process including, for example, duration, temperature, pressure, source power, bias voltage, bias power, and/or etchant flow rate may be adjusted to control the selectively removal of the vertical portion of the dielectric liner 248'. In some embodiments, the third etching process includes a dry etching process and implements same etchant gas(es) as the primary etching process employed in the second etching process, and a bias voltage applied during the second etching process is higher than a bias voltage applied during the third etching process. In an embodiment, the third etching process may be an isotropic dry etching process with its bias voltage substantially equals 0, and the second etching process is an anisotropic dry etching process with its bias voltage greater than 0.

Figure 22:
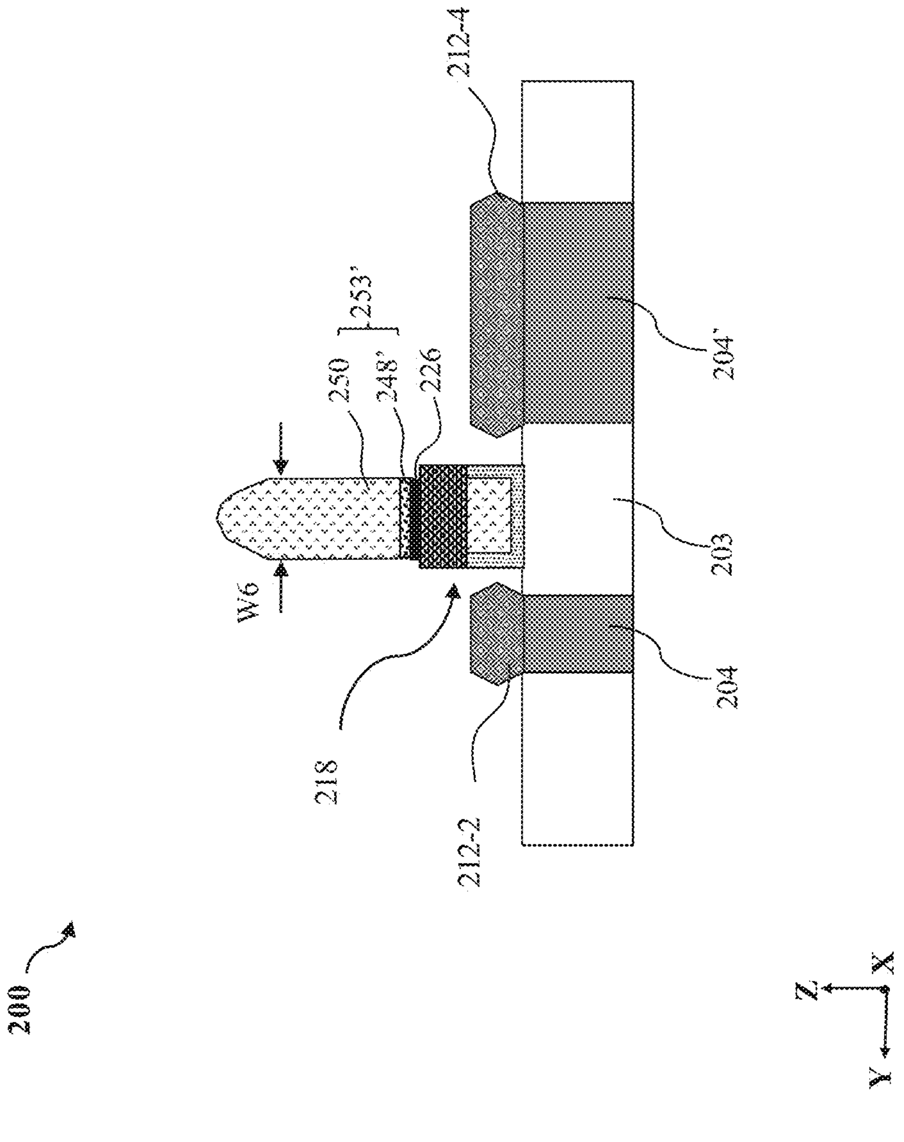
Figure 23:
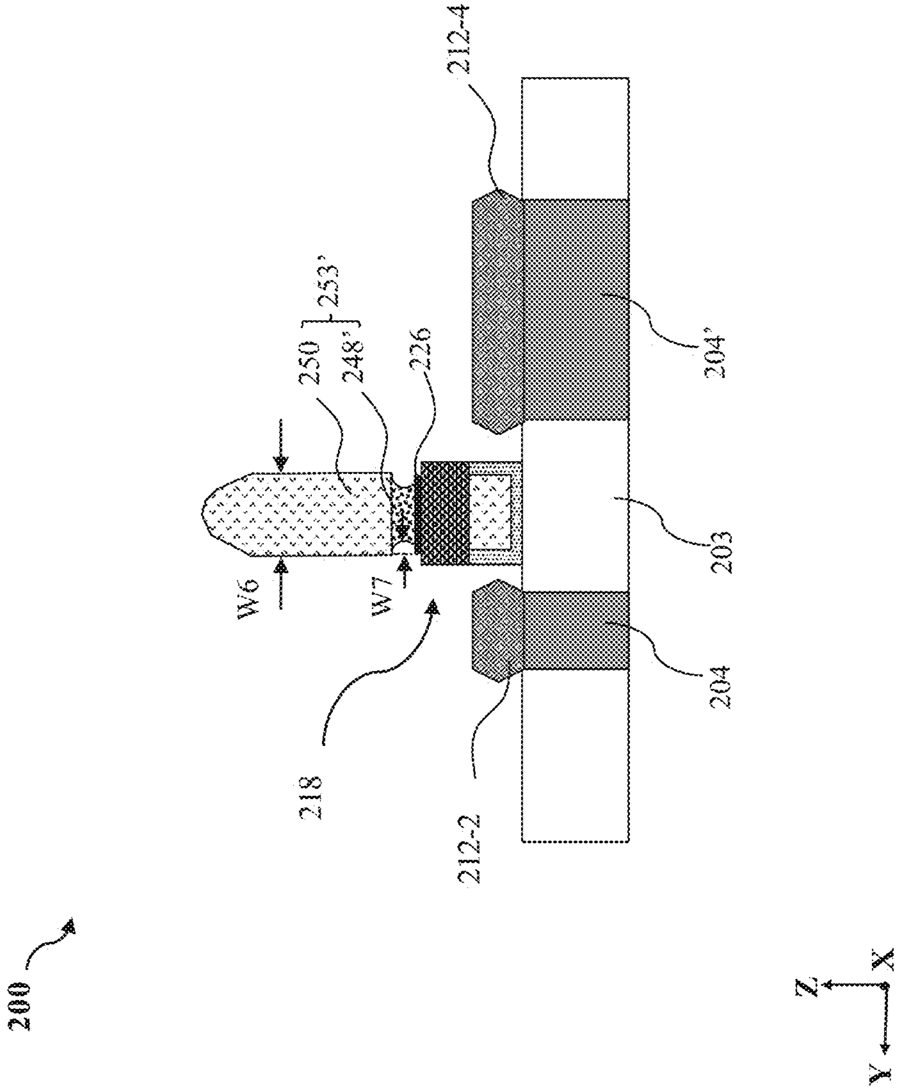

FIGS. 22-23 illustrate fragmentary cross-sectional views of alternative embodiments of the workpiece 200 along line C-C' after the implementation of the third etching process. In embodiments represented in FIG. 22, the dielectric liner 248' includes a portion disposed directly under the dielectric filler 250, and a width of the dielectric liner 248' is substantially equal to the width W6 of the dielectric filler 250. The CESL 226 is sandwiched between the hybrid cut feature 253' and the dielectric fin 218.

In embodiments represented in FIG. 23, the dielectric liner 248' is disposed between the CESL 226 and the dielectric filler 250. The dielectric filler 250 overhangs the dielectric liner 248'. That is, the width W6 of the dielectric filler 250 is greater than the width of the dielectric liner 248'. Since the third etching process includes an isotropic dry etching process, the dielectric liner 248' may include sidewalls that curve inward. In an embodiment, the sidewall surface has a dome height W7 along the Y direction. A ratio of W7 to W6 (i.e., W7/W6) may be no greater than ⅓ to prevent the dielectric filler 250 formed on the dielectric liner 248' from being collapsing. In an embodiment, given the dimension of the width W6, W7 may be between about 1.5 nm and about 33 nm to prevent the dielectric filler 250 from being collapsing.

Figure 24:
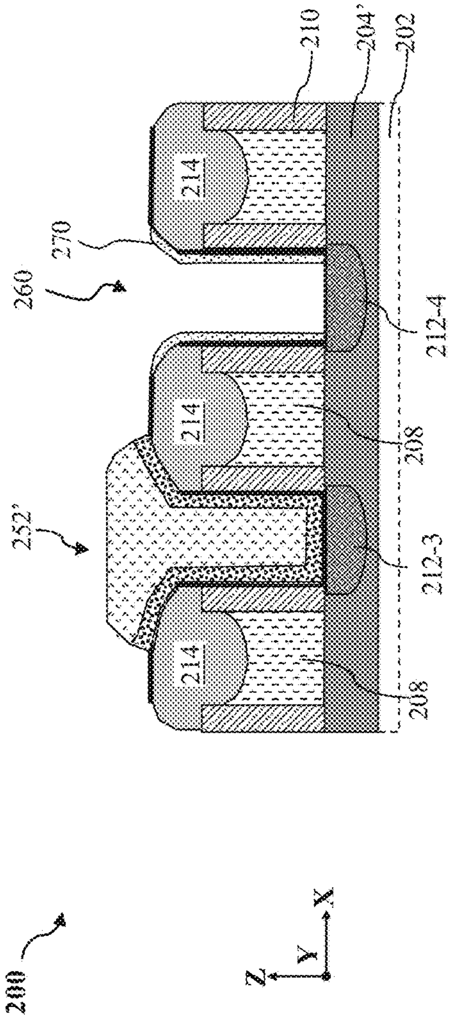
Figure 25:
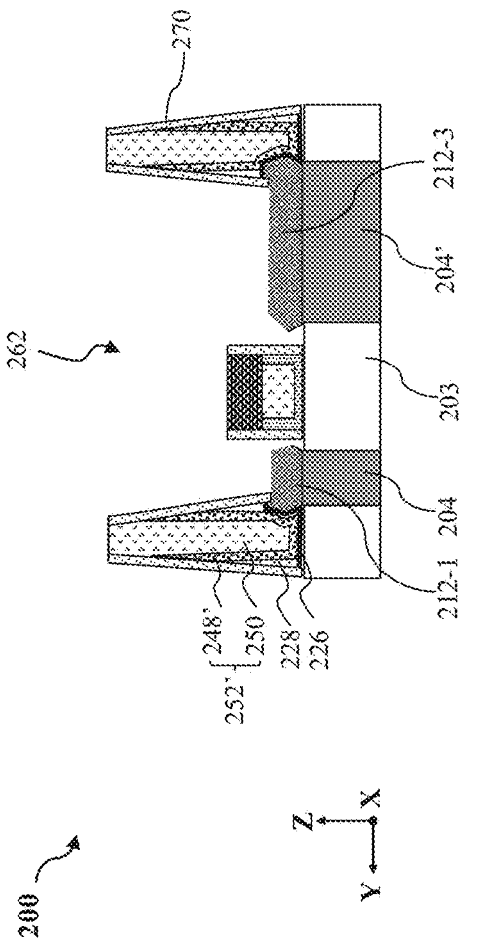

Referring to FIGS. 1, 24, and 25, method 100 includes a block 114 where a spacer layer 270 is formed along sidewalls of the contact openings. FIG. 24 illustrates a fragmentary cross-sectional view of the workpiece 200 along line A-A' and FIG. 25 illustrates a fragmentary cross-sectional view of the workpiece 200 along line B-B'. In an exemplary process, a spacer layer material is conformally deposited over the workpiece 200. The spacer layer material may include silicon nitride (SiN) or a suitable nitrogen-containing dielectric material. Thereafter, the deposited spacer layer material is etched back to remove the spacer layer material on top-facing surfaces to form the spacer layer 270. In embodiments represented in FIG. 24, the spacer layer 270 is disposed directly on the fourth source/drain feature 212-4 and extends along sidewalls of the gate spacers 210. In embodiments represented in FIG. 25, the spacer layer 270 extends along sidewalls of the contact openings 260, 262 and 264, including sidewalls of the dielectric fin 218, and sidewalls of the hybrid cut features 252' and 253'. The fragmentary cross-sectional view of the workpiece 200 along line C-C' is omitted for reason of simplicity.

Figure 26:
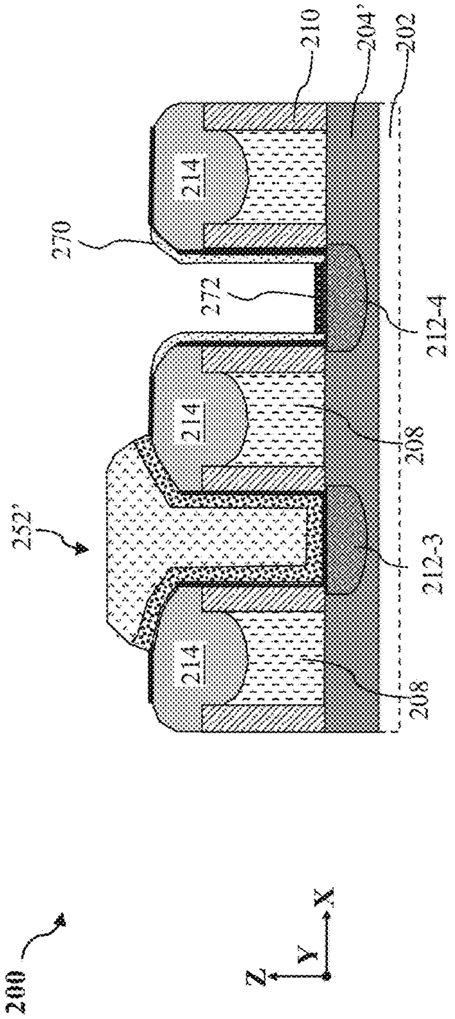
Figure 27:
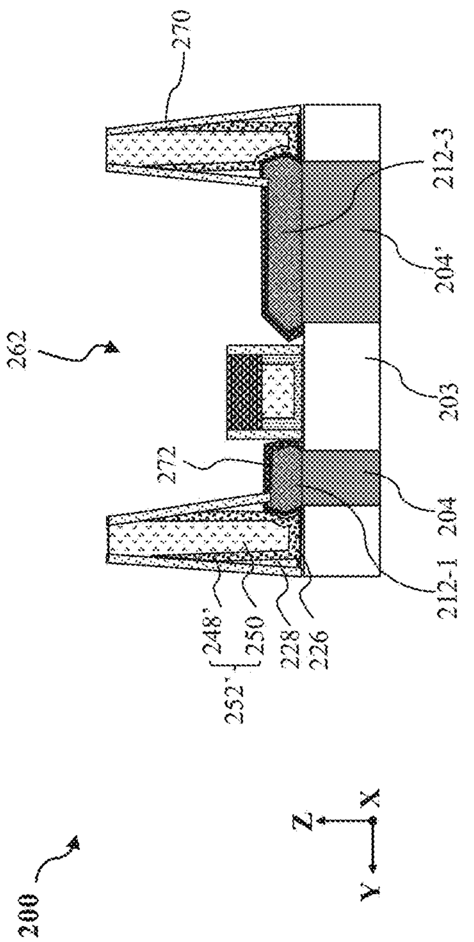

Referring to FIGS. 1, 26 and 27, method 100 includes a block 116 where a silicide feature 272 is formed over the exposed portions of the source/drain features 212. In an exemplary process, a metal precursor layer may be conformally deposited over the workpiece 200, including in the contact openings. In some instances, the metal precursor layer may be deposited using physical vapor deposition (PVD), CVD, or ALD and may include nickel (Ni), cobalt (Co), tantalum (Ta), or titanium (Ti). The workpiece 200 is then annealed to bring about silicidation reaction between silicon in the source/drain features 212 and the metal precursor layer. The silicidation reaction results in a silicide feature 272 on the source/drain features 212. In some examples, the silicide feature 272 may include nickel silicide, cobalt silicide, tantalum silicide, or titanium silicide.

Figure 28:
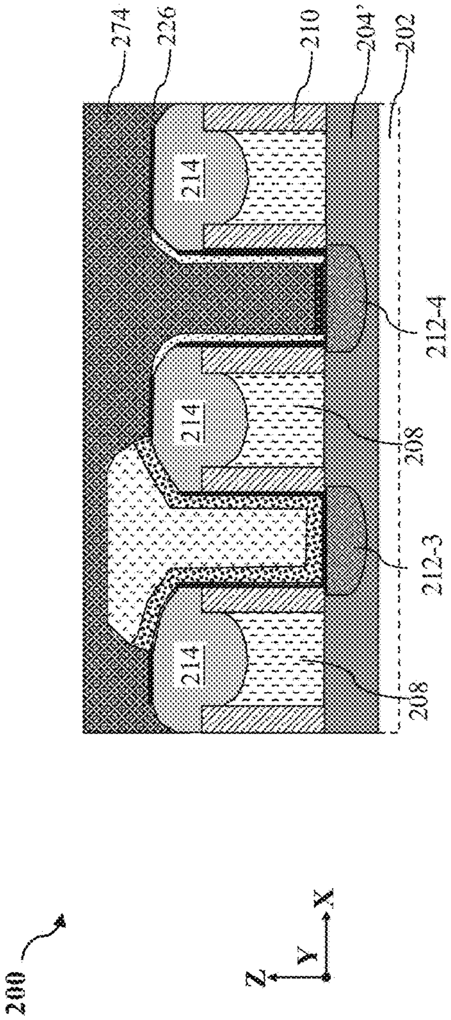
Figure 29:
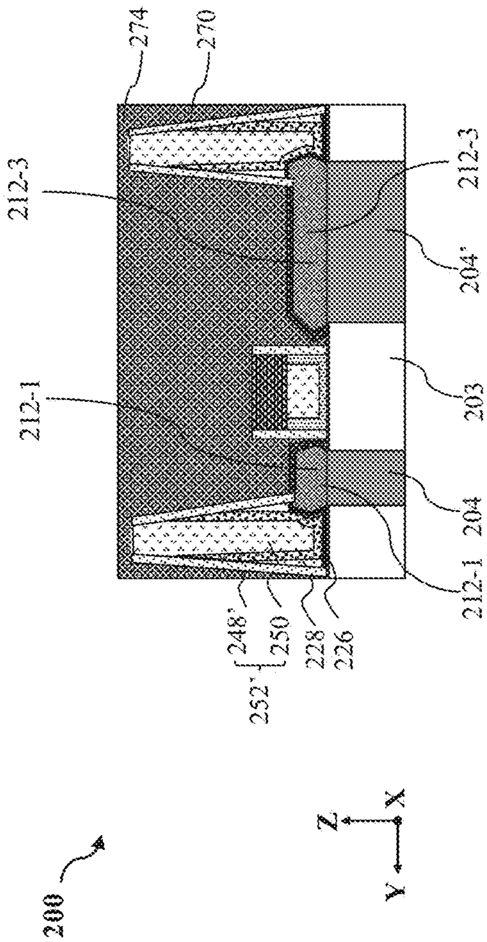

Referring to FIGS. 1, 28 and 29, method 100 includes a block 118 where a metal fill layer 274 is deposited over the silicide feature 272 to fill the contact openings. In some embodiments, at block 118, the metal fill layer 274 is in direct contact with the silicide feature 272 and is in electrical communication with the source/drain features 212 by way of the silicide feature 272. In some instances, the metal fill layer 274 may include tungsten (W), ruthenium (Ru), cobalt (Co), copper (Cu), titanium (Ti), titanium nitride (TiN), tantalum (Ta), tantalum nitride (TaN), molybdenum (Mo), or nickel (Ni) and may be deposited using PVD or a suitable deposition method.

Figure 30:
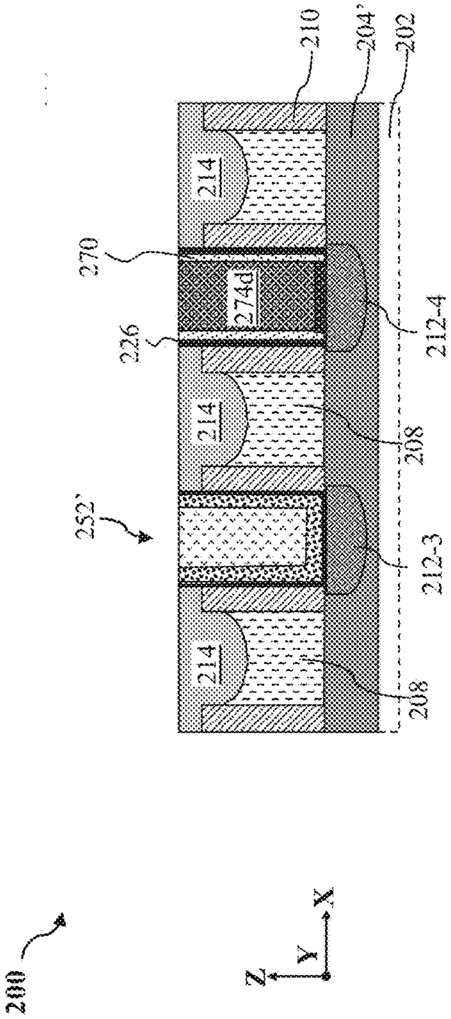
Figure 31:
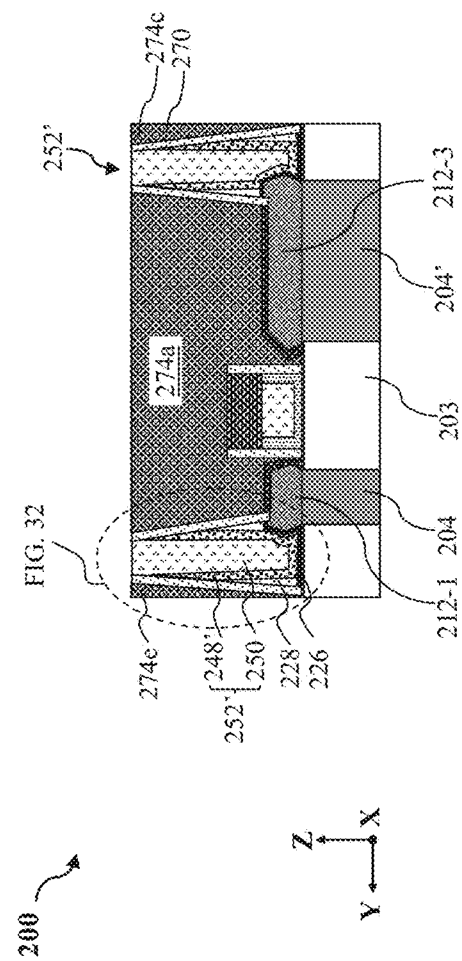
Figure 32:
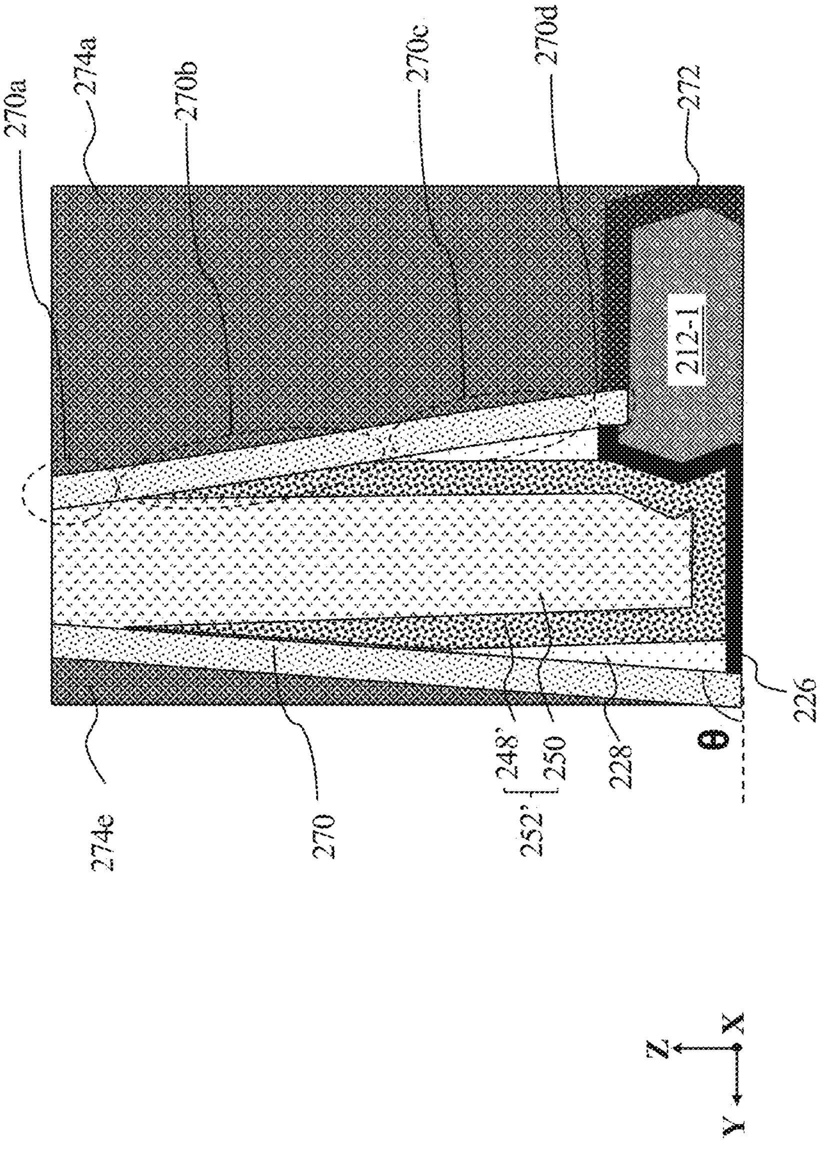
Figure 33:
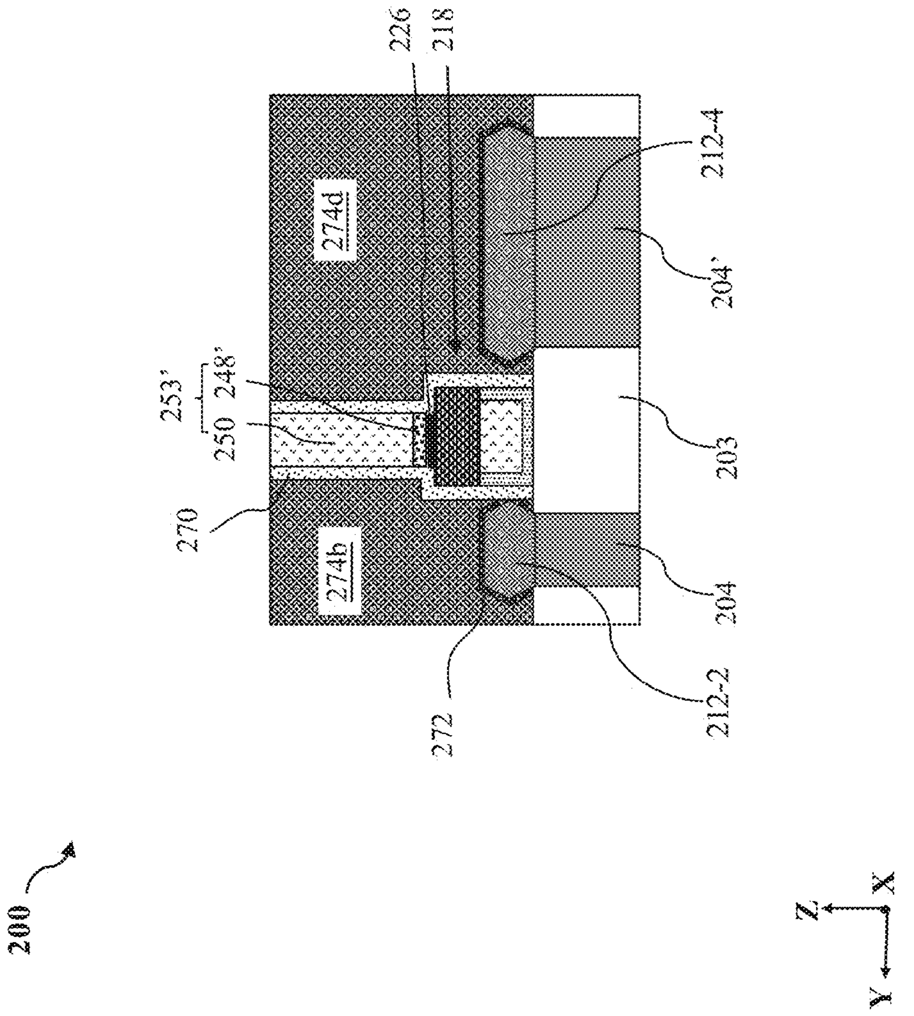

Referring to FIGS. 1 and 30-33, method 100 includes a block 118 where a planarization process is performed. After forming the metal fill layer 274, the workpiece 200 is then planarized until the SAC layers 214 and the hybrid cut features 252' and 253' are exposed on a top planar surface of the workpiece 200. FIG. 30 illustrates a fragmentary cross-sectional view of the workpiece 200 along line A-A', FIG. 31 illustrates a fragmentary cross-sectional view of the workpiece 200 along line B-B' and the dotted area in FIG. 31 is enlarged and shown in FIG. 32, and FIG. 33 illustrates a fragmentary cross-sectional view of the workpiece 200 along line C-C'. The planarization process removes the connecting portion of the metal fill layer 274 and allows the hybrid cut features 252' and 253' to divide metal fill layer 274 into separate contact features such as **274*a*, 274*b*, 274*c*, 274*d*, and 274*e*. Each of the contact features track the shape of the corresponding contact openings. After the planarization process at block 116, a first source/drain contact 274*a* (shown in FIG. 31) is formed directly over both the first source/drain feature 212-1 and the third source/drain feature 212-3 and is spaced apart from adjacent source/drain contacts 274***e* and 274*c* by the hybrid cut features 252'. A second source/drain contact 274*b* (shown in FIG. 33) is formed over the second source/drain feature 212-2, and a fourth source/drain contact 274*d* is formed over the fourth source/drain feature 212-4. The second source/drain contact 274*b* is spaced apart from the fourth source/drain contact 274*d* by the dielectric fin 218 and the hybrid cut feature 253' thereon. Due to the dimension-reduced hybrid cut features 252' and 253', a distance between two adjacent source/drain contacts (e.g., adjacent source/drain contacts 274*a* and 274*e* shown in FIG. 31, adjacent source/drain contacts 274*a* and 274*c* shown in FIG. 31, adjacent source/drain contacts 274*b* and 274*d* shown in FIG. 33) is advantageously reduced, leading to densely spaced source/drain contacts.

As shown in FIG. 31, along the Y direction and along line B-B', the first source/drain contact 274*a* is disposed between two hybrid cut features 252' and disposed directly over the first source/drain feature 212-1 and the third source/drain feature 212-3. That is, the first source/drain contact 274*a* is electrically coupled to both the first source/drain feature 212-1 and the third source/drain feature 212-3. The first source/drain contact 274*a* is also disposed over the dielectric fin 218 disposed between the first source/drain feature 212-1 and the third source/drain feature 212-3. The top surface of the hybrid cut feature 252' is higher than the top surface of the dielectric fin 218. In embodiments represented in FIG. 31, the first source/drain contact 274*a* includes a tapered side profile. More specifically, along the Y direction, a width of the top surface of the first source/drain contact 274*a* is greater than a width of the bottom surface of the first source/drain contact 274*a*. It is noted that, the profile of the first source/drain contact 274*a* may vary with respect to the profiles of the hybrid cut feature 252' and the contact opening 262. For example, as described with reference to FIG. 19, the workpiece 200 includes the contact opening 262' having a profile different than the contact opening 262. Accordingly, the contact feature formed in the contact opening 262' would have a profile different than the first source/drain contact 274*a* to track the shape of the contact opening 262'.

The dotted area in FIG. 31 is enlarged and shown in FIG. 32. In embodiments represented in FIG. 32, the spacer layer 270 includes a first portion 270*a* in direct contact with the dielectric filler 250, a second portion 270*b* in direct contact with the dielectric liner 248', a third portion 270*c* in direct contact with the first ILD layer 228, and a fourth portion 270*d* in direct contact with the CESL 226, the first source/drain feature 212-1, and the silicide feature 272. The first, second, and the third portion 270*a*, 270*b*, and 270*c* are also in direct contact with the source/drain contact 274*a*. The fourth portion 270*d* is disposed between the CESL 226 and the silicide feature 272 and is not in direct contact with the source/drain contact 274*a*. It is noted that, in embodiments where the workpiece 200 includes a hybrid cut feature 252' (e.g., the hybrid cut feature 252' shown in FIG. 19) having a different profile, the positional relationships between the spacer layer 270 and the surrounding features in the workpiece 200 may be changed accordingly. In an embodiment, due to the second etching process used in forming the enlarged contact opening 262 (shown in FIG. 18) in block 112, an angle θ between the spacer layer 270 and the Y axis is between about 80° and about 88°.

FIG. 33 illustrates a fragmentary cross-sectional view of the workpiece 200 along line C-C'. The spacer layer 270 extending along the sidewall of the hybrid cut feature 253' and the dielectric fin 218. The second source/drain contact 274*b* is formed over and electrically coupled to the second source/drain feature 212-2 via the silicide feature 272. The fourth source/drain contact 274*d* is formed over and electrically coupled to the fourth source/drain feature 212-4 via the silicide feature 272. The fourth source/drain contact 274*d* is spaced apart from the second source/drain contact 274*b* by the dimension-reduced hybrid cut feature 253', the dielectric fin 218, the CESL 226 disposed therebetween, and the spacer layer 270 extending along the sidewalls thereof. In this depicted example, along the Y direction, the second source/drain contact 274*b* includes a top portion having a width greater than the width of the bottom portion of the second source/drain contact 274*b*, and the fourth source/drain contact 274*d* includes a top portion having a width greater than the width of the bottom portion of the fourth source/drain contact 274*d*. Therefore, a distance between the second source/drain contact 274*b* and the fourth source/drain contact 274*d* is advantageously reduced. Embodiments where source/drain contacts formed over the workpiece 200 shown in FIG. 21 and FIG. 23 are omitted for reason of simplicity.

Referring to FIG. 1, method 100 includes a block 120 where further processes are performed. Such further processes may include formation of contact vias over source/drain contacts, formation of gate contacts, and formation of an interconnect structure over the workpiece 200. The interconnect structure includes a plurality of metal layers embedded in a plurality of intermetal dielectric (IMD) layer. Each of plurality of metal layers includes plurality of metal lines and a plurality of contact vias. The interconnect structure functionally connects the gate contacts and the source/drain contacts and allows the semiconductor device 200 to perform its intended functions.

Embodiments of the present disclosure provide benefits. For example, the present disclosure provides a hybrid cut feature configured to divide a source/drain contact structure into multiple pieces, and methods of forming the same. The methods employ a hybrid cut feature including a dielectric liner and a dielectric filler having different etching rates with respect to an etching process employed in the contact opening formation process. By selectively removing a portion of the dielectric liner, the dimension of the hybrid cut feature and thus the spacing between two adjacent source/drain contacts of the source/drain contact structure are reduced without significantly affecting the electrical isolation between two adjacent source/drain contacts. Embodiments of the disclosed methods can be readily integrated into existing processes and technologies for manufacturing MBC transistors, FinFETs, and/or other suitable devices.

The present disclosure provides for many different embodiments. Semiconductor structures and methods of fabrication thereof are disclosed herein. In one exemplary aspect, the present disclosure is directed to a method. The method includes receiving a workpiece. The workpiece includes a first source/drain feature over a first fin-shaped structure, a second source/drain feature over a second fin-shaped structure, and a dielectric layer over the first source/drain feature and the second source/drain feature. The method also includes removing a first portion of the dielectric layer to form a first trench and a second portion of the dielectric layer to form a second trench, conformally depositing a dielectric liner over the first trench and the second trench, depositing a dielectric filler over the dielectric liner to fill the first trench and the second trench, selectively removing a third portion of the dielectric layer and a portion of the dielectric liner adjacent to the third portion of the dielectric layer to form a contact opening, and forming a contact feature in the contact opening. The third portion of the dielectric layer is disposed directly over both the first source/drain feature and the second source/drain feature.

In some embodiments, an edge portion of the first source/drain feature may be exposed in the first trench, an edge portion of the second source/drain feature may be exposed in the second trench. In some embodiments, the portion of the dielectric liner may extend along a sidewall of the dielectric filler. In some embodiments, the workpiece may include a gate structure disposed over a channel region of the first fin-shaped structure, the channel region being adjacent to the first source/drain feature, and, after the selectively removing, the dielectric filler may be spaced apart from the gate structure by the dielectric liner.

In some embodiments, the workpiece may include an etch stop layer on the first source/drain feature and the second source/drain feature, and, after the selectively removing, the dielectric liner may be sandwiched between the etch stop layer and the dielectric filler. In some embodiments, the selectively removing may include performing a first etching process to selectively remove the third portion of the dielectric layer and the portion of the dielectric liner and performing a second etching process to selectively remove a portion of the etch stop layer disposed directly on the first source/drain feature and the second source/drain feature.

In some embodiments, the method may also include performing a third etching process to selectively trim the dielectric liner. An etchant of the third etching process may be the same as an etchant of the first etching process. In some embodiments, the first etching process may include an anisotropic dry etching process, and the third etching process may include an isotropic dry etching process, and a bias voltage of the third etching process may be smaller than a bias voltage of the first etching process. In some embodiments, the method may also include, after the selectively removing, forming a spacer layer over the workpiece. The spacer layer may be in direct contact with both the dielectric filler and the dielectric liner and disposed over the first source/drain feature.

In another exemplary aspect, the present disclosure is directed to a method. The method includes receiving a workpiece includes a first source/drain feature and a second source/drain feature, a dielectric fin disposed between the first source/drain feature and the second source/drain feature, and a dielectric layer over the first source/drain feature, the second source/drain feature, and the dielectric fin. The method also includes selectively removing a portion of the dielectric layer disposed directly over the dielectric fin to form an opening, forming a hybrid dielectric feature to fill the opening, performing an etching process to selectively remove a first portion and a second portion of the dielectric layer to form a first trench exposing the first source/drain feature and a second trench exposing the second source/drain feature, respectively. The etching process also removes an upper portion of the hybrid dielectric feature. The method also includes forming a first contact feature over the first trench and a second contact feature over the second trench, the first contact feature and the second contact feature being spaced apart by the hybrid dielectric feature.

In some embodiments, the forming of the first contact feature and the second contact feature may include depositing a contact feature layer over the workpiece and performing a planarization process to the workpiece to expose a top surface of the hybrid dielectric feature such that the contact feature layer is divided by the hybrid dielectric feature into the first contact feature and the second contact feature. In some embodiments, the forming of the hybrid dielectric feature may include conformally depositing a dielectric liner over the opening such that the dielectric liner is disposed directly over the dielectric fin and depositing a dielectric filler over the dielectric liner. A composition of the dielectric filler may be more etch-resistant than the dielectric liner with respect to the etching process.

In some embodiments, the dielectric liner may include silicon oxide, the dielectric filler may include silicon, silicon nitride, silicon carbonitride, silicon oxycarbonitride, silicon oxynitride, or aluminum oxide. In some embodiments, a composition of the dielectric liner may be the same as a composition of the dielectric layer. In some embodiments, before the performing of the etching process, the dielectric liner may have a first width along a first direction substantially perpendicular to a lengthwise direction of the dielectric fin, and the dielectric filler may have a second width along the first direction, and a ratio of the second width to the first width may be between about 0.2 and about 10. In some embodiments, after the performing of the etching process, a width of a top surface of the hybrid dielectric feature may be smaller than a width of a bottom surface of the hybrid dielectric feature.

In yet another exemplary aspect, the present disclosure is directed to a semiconductor structure. The semiconductor structure includes a substrate, a first source/drain feature and a second source/drain feature over the substrate, a dielectric fin disposed over the substrate and configured to separate the first source/drain feature and the second source/drain feature, an etch stop layer disposed over the substrate and on a portion of the first source/drain feature and a portion of the second source/drain feature, a first dielectric feature disposed adjacent to the first source/drain feature, a second dielectric feature disposed adjacent to the second source/drain feature, and a contact feature disposed laterally between the first dielectric feature and the second dielectric feature and electrically coupled to the first source/drain feature and the second source/drain feature. The first dielectric feature and the second dielectric feature are spaced apart from the substrate by the etch stop layer. The first dielectric feature and the second dielectric feature each include a first dielectric layer and a second dielectric layer over the first dielectric layer, the second dielectric layer is spaced apart from the etch stop layer by the first dielectric layer, and a composition of the first dielectric layer is different from a composition of the etch stop layer.

In some embodiments, the semiconductor structure may also include a gate structure disposed over the substrate and a gate spacer extending along a sidewall of the gate structure. The first dielectric feature may be spaced apart from the gate spacer by the etch stop layer. In some embodiments, the semiconductor structure may also include a dielectric spacer extending along a sidewall of the first dielectric feature. The first dielectric feature may be spaced apart from the contact feature by the dielectric spacer, and the dielectric spacer may be in direct contact with the first dielectric layer and the second dielectric layer. In some embodiments, the first dielectric feature may include a top surface having a first width and a bottom surface having a second width greater than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece comprising:

a first source/drain feature over a first fin-shaped structure, a second source/drain feature over a second fin-shaped structure and adjacent to the first source/drain feature along a first direction, an etch stop layer over the first source/drain feature and the second source/drain feature and a dielectric layer over the etch stop layer;

removing a first portion of the dielectric layer to form a first trench extending through the dielectric layer and a second portion of the dielectric layer to form a second trench extending through the dielectric layer, the second trench being spaced apart from the first trench along the first direction;

conformally depositing a dielectric liner over the first trench and the second trench, wherein the dielectric liner and the dielectric layer are formed of a same material;

depositing a dielectric filler over the dielectric liner to fill the first trench and the second trench, wherein the dielectric filler and the dielectric layer are formed of different materials;

after the depositing of the dielectric filler, performing a planarization process to the workpiece, wherein, after the performing of the planarization process, top surfaces of the dielectric liner, the dielectric filler, and the dielectric layer are coplanar;

after the performing of the planarization process, selectively removing a third portion of the dielectric layer and a portion of the dielectric liner adjacent to the third portion of the dielectric layer to form a contact opening, the third portion of the dielectric layer being disposed directly over both the first source/drain feature and the second source/drain feature, wherein, after the selectively removing, the dielectric liner is vertically sandwiched between the etch stop layer and the dielectric filler; and forming a contact feature in the contact opening.

2. The method of claim 1, wherein an edge portion of the first source/drain feature is vertically overlapped with the first trench, wherein an edge portion of the second source/drain feature is vertically overlapped with the second trench.

3. The method of claim 1, wherein the portion of the dielectric liner extends along a sidewall of the dielectric filler.

4. The method of claim 1, wherein the workpiece further comprises a gate structure disposed over a channel region of the first fin-shaped structure, the channel region being adjacent to the first source/drain feature, wherein, after the selectively removing, the dielectric filler is spaced apart from the gate structure by the dielectric liner.

5. The method of claim 1, wherein the selectively removing comprises:

performing a first etching process to selectively remove the third portion of the dielectric layer and the portion of the dielectric liner; and performing a second etching process to selectively remove a portion of the etch stop layer disposed directly on the first source/drain feature and the second source/drain feature.

6. The method of claim 5, further comprising:

performing a third etching process to selectively trim the dielectric liner, wherein an etchant of the third etching process is the same as an etchant of the first etching process.

7. The method of claim 6, wherein the first etching process comprises an anisotropic dry etching process, and the third etching process comprises an isotropic dry etching process, wherein a bias voltage of the third etching process is less than a bias voltage of the first etching process.

8. The method of claim 1, further comprising:

after the selectively removing, forming a spacer layer over the workpiece, wherein the spacer layer is in direct contact with both the dielectric filler and the dielectric liner and disposed over the first source/drain feature.

9. A method, comprising:

receiving a workpiece comprising:

a first source/drain feature and a second source/drain feature, a dielectric fin disposed between the first source/drain feature and the second source/drain feature along a first direction, wherein a top surface of the dielectric fin is above a top surface of the first source/drain feature, and a dielectric layer over the first source/drain feature, the second source/drain feature, and the dielectric fin;

selectively removing a portion of the dielectric layer disposed directly over the dielectric fin to form an opening;

forming a dielectric feature to fill the opening, wherein the dielectric feature comprises a dielectric filler and a dielectric liner extending continuously along a sidewall surface and a bottom surface of the dielectric filler, wherein the dielectric filler has a different composition than the dielectric liner, and wherein the dielectric liner comprises a first part covers the sidewall surface and a second part under the bottom surface;

performing an etching process to selectively remove a first portion and a second portion of the dielectric layer to form a first trench exposing the first source/drain feature and a second trench exposing the second source/drain feature, respectively, wherein, the etching process further fully removes the first part of the dielectric liner without removing the second part of the dielectric liner; and forming a first contact feature in the first trench and a second contact feature in the second trench, the first contact feature and the second contact feature being spaced apart by the dielectric feature.

10. The method of claim 9, wherein the forming of the first contact feature and the second contact feature comprises:

depositing a contact feature layer over the workpiece; and performing a planarization process to the workpiece to expose a top surface of the dielectric feature such that the contact feature layer is divided by the dielectric feature into the first contact feature and the second contact feature.

11. The method of claim 9, wherein the forming of the dielectric feature comprises:

conformally depositing the dielectric liner over the opening such that the dielectric liner is disposed directly over the dielectric fin; and depositing the dielectric filler over the dielectric liner, wherein the composition of the dielectric filler is more etch-resistant than the dielectric liner with respect to the etching process.

12. The method of claim 11, wherein the dielectric liner comprises silicon oxide, wherein the dielectric filler comprises silicon, silicon nitride, silicon carbonitride, silicon oxycarbonitride, silicon oxynitride, or aluminum oxide.

13. The method of claim 11, wherein a composition of the dielectric liner is the same as a composition of the dielectric layer.

14. The method of claim 11, wherein, before the performing of the etching process, the dielectric liner has a third width along a first direction substantially perpendicular to a lengthwise direction of the dielectric fin, and the dielectric filler has a fourth width along the first direction, wherein a ratio of the fourth width to the third width is between about 0.2 and about 10.

15. The method of claim 9, wherein, after the performing of the etching process, a width of the dielectric feature is less than a width of the dielectric fin.

16. The method of claim 9, further comprising:

before the forming of the first contact feature, forming a dielectric barrier layer extending along sidewalls of the dielectric fin and the dielectric feature.

17. A method, comprising:

forming a source/drain feature over a substrate;

forming a gate structure over the substrate and adjacent to the source/drain feature;

forming an etch stop layer on the source/drain feature;

forming a dielectric layer over the etch stop layer;

performing a first etching process to form a first trench extending through the dielectric layer without exposing the source/drain feature;

forming an isolation feature in the first trench, wherein the isolation feature comprises a first insulation layer and a second insulation layer extending along a sidewall surface of the first insulation layer;

after the forming of the isolation feature, performing a second etching process to form a second trench extending through the dielectric layer, wherein the second trench exposes at least a portion of the source/drain feature, and wherein the performing of the second etching process further reduces a thickness of a portion of the second insulation layer; and after the performing of the second etching process, forming a source/drain contact in the second trench and electrically coupled to the source/drain feature, wherein, in a cross-sectional view cut through the source/drain feature without cutting through the gate structure, a top surface of the source/drain contact is above a topmost surface of the second insulation layer.

18. The method of claim 17, wherein the portion of the second insulation layer is a first portion of the second insulation layer, and the performing of the second etching process further removes a second portion of the second insulation layer over the first portion of the second insulation layer.

19. The method of claim 17, wherein the forming of the isolation feature comprises:

conformally depositing a first material layer over the dielectric layer to partially fill the first trench;

forming a second material layer over the first material layer to fill a remaining portion of the first trench; and performing a planarization process.

20. The method of claim 17, further comprising:

after the performing of the second etching process, forming a spacer layer extending along a sidewall surface of the isolation feature; and forming a silicide layer on the source/drain feature, wherein the spacer layer is in direct contact with the etch stop layer, the second insulation layer and the first insulation layer.

* * * * *